US010223944B2

(12) United States Patent
Nall et al.

(10) Patent No.: US 10,223,944 B2
(45) Date of Patent: Mar. 5, 2019

(54) LED BACKLIGHT SYSTEM FOR CABINET SIGN

(71) Applicants: Jeffrey Marc Nall, Brecksville, OH (US); Kevin Carpenter, Shaker Heights, OH (US); Koushik Saha, Brunswick, OH (US); Chenyang Li, Shanghai (CN); Ronald K. Brengartner, Jr., Strongsville, OH (US); Xin Wang, Shanghai (CN); Tomislav J. Stimac, Concord, OH (US)

(72) Inventors: Jeffrey Marc Nall, Brecksville, OH (US); Kevin Carpenter, Shaker Heights, OH (US); Koushik Saha, Brunswick, OH (US); Chenyang Li, Shanghai (CN); Ronald K. Brengartner, Jr., Strongsville, OH (US); Xin Wang, Shanghai (CN); Tomislav J. Stimac, Concord, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 486 days.

(21) Appl. No.: 14/181,087

(22) Filed: Feb. 14, 2014

(65) Prior Publication Data

US 2014/0254140 A1 Sep. 11, 2014

Related U.S. Application Data

(63) Continuation of application No. 11/784,639, filed on Apr. 9, 2007.

(Continued)

(51) Int. Cl.
*H01L 51/50* (2006.01)
*G09F 13/22* (2006.01)
(Continued)

(52) U.S. Cl.
CPC .............. *G09F 13/04* (2013.01); *F21S 2/005* (2013.01); *F21V 19/003* (2013.01); *F21V 21/14* (2013.01);
(Continued)

(58) Field of Classification Search
USPC ............ 362/97.1–97.4, 812, 249.02, 249.06, 362/249.09, 311.02, 800; 40/446, 448
See application file for complete search history.

(56) References Cited

U.S. PATENT DOCUMENTS

D768,257 S 8/1904 Adams
4,004,360 A * 1/1977 Hammond ...................... 40/361
(Continued)

FOREIGN PATENT DOCUMENTS

EP 2498417 A2 12/2012
JP 121122 A 12/1995

OTHER PUBLICATIONS

English Translation of Japanese Patent No. 121122, printed on May 17, 2016.

*Primary Examiner* — Shin H Kim
(74) *Attorney, Agent, or Firm* — Fay Sharpe LLP

(57) ABSTRACT

A backlighting system for a cabinet sign may include a plurality of panels. Each panel includes a plurality of light emitting diodes ("LEDs") attached to the panel. The diode has a box sign depth factor of less than about 1.4. An integrated circuit may also be located on the panel. A wire physically connects adjacent panels.

47 Claims, 32 Drawing Sheets

Related U.S. Application Data

(60) Provisional application No. 60/849,653, filed on Oct. 5, 2006.

(51) Int. Cl.

| | |
|---|---|
| ***G09F 13/04*** | (2006.01) |
| ***F21V 29/507*** | (2015.01) |
| ***F21V 21/14*** | (2006.01) |
| ***F21V 19/00*** | (2006.01) |
| ***F21S 2/00*** | (2016.01) |
| ***F21V 23/00*** | (2015.01) |
| ***F21V 23/06*** | (2006.01) |
| *F21Y 105/10* | (2016.01) |
| *F21Y 103/10* | (2016.01) |
| *F21Y 115/10* | (2016.01) |

(52) U.S. Cl.

CPC .......... *F21V 23/004* (2013.01); *F21V 23/005* (2013.01); *F21V 23/06* (2013.01); *F21V 29/507* (2015.01); *G09F 13/22* (2013.01); *F21Y 2103/10* (2016.08); *F21Y 2105/10* (2016.08); *F21Y 2115/10* (2016.08); *G09F 2013/0418* (2013.01); *G09F 2013/222* (2013.01); *Y10T 29/49002* (2015.01); *Y10T 29/49117* (2015.01)

(56) References Cited

U.S. PATENT DOCUMENTS

| | | | | |
|---|---|---|---|---|
| 4,733,486 | A * | 3/1988 | Gawell | 40/451 |
| 4,855,882 | A | 8/1989 | Boss | |
| 5,022,171 | A * | 6/1991 | Norfolk et al. | 40/447 |
| 5,241,457 | A * | 8/1993 | Sasajima et al. | 362/503 |
| 5,404,282 | A | 4/1995 | Klinke et al. | |
| 5,697,175 | A * | 12/1997 | Schwartz | 40/552 |
| 5,788,577 | A * | 8/1998 | Kadota et al. | 464/111 |
| 5,829,865 | A * | 11/1998 | Ahroni | 362/657 |
| 5,896,688 | A * | 4/1999 | Aiken et al. | 40/519 |
| 5,900,850 | A | 5/1999 | Bailey et al. | |
| 6,167,648 | B1 * | 1/2001 | Dimmick | 40/564 |
| 6,169,632 | B1 * | 1/2001 | Kurtenbach et al. | 359/621 |
| 6,201,353 | B1 | 3/2001 | Chang et al. | |
| 6,249,088 | B1 | 6/2001 | Chang | |
| 6,314,669 | B1 * | 11/2001 | Tucker | 40/448 |
| 6,346,005 | B1 | 2/2002 | Viklund et al. | |
| 6,394,626 | B1 * | 5/2002 | McColloch | 362/231 |
| 6,489,631 | B2 | 12/2002 | Young et al. | |
| 6,504,984 | B1 | 1/2003 | Wakeman et al. | |
| 6,505,956 | B1 * | 1/2003 | Priddy et al. | 362/249.04 |
| 6,536,914 | B2 * | 3/2003 | Hoelen et al. | 362/231 |
| 6,554,676 | B1 * | 4/2003 | Bach | 446/116 |
| 6,566,824 | B2 * | 5/2003 | Panagotacos et al. | 315/291 |
| 6,660,935 | B2 * | 12/2003 | Southard et al. | 362/640 |
| 6,679,751 | B1 * | 1/2004 | Maxwell et al. | 446/91 |
| 6,741,222 | B1 * | 5/2004 | Tucker | 345/1.1 |
| 6,761,471 | B2 | 7/2004 | Wu | |
| 6,805,468 | B2 * | 10/2004 | Itoh et al. | 362/362 |
| 6,813,853 | B1 * | 11/2004 | Tucker | 40/448 |
| 6,969,179 | B2 | 11/2005 | Sloan et al. | |
| 7,000,999 | B2 | 2/2006 | Ryan, Jr. | |
| 7,052,152 | B2 * | 5/2006 | Harbers et al. | 362/30 |
| 7,114,831 | B2 | 10/2006 | Popovich et al. | |
| 7,165,863 | B1 * | 1/2007 | Thomas et al. | 362/219 |
| 7,201,511 | B2 * | 4/2007 | Moriyama et al. | 362/646 |
| 7,217,012 | B2 * | 5/2007 | Southard et al. | 362/391 |
| 7,377,669 | B2 * | 5/2008 | Farmer et al. | 362/249.01 |
| 7,429,186 | B2 * | 9/2008 | Mrakovich et al. | 439/404 |
| 7,481,563 | B2 | 1/2009 | David et al. | |
| 7,506,995 | B2 * | 3/2009 | Thomas et al. | 362/227 |
| 7,520,771 | B2 | 4/2009 | Nall et al. | |
| 7,648,254 | B2 | 1/2010 | Yoo et al. | |
| 7,648,257 | B2 | 1/2010 | Villard | |
| 7,673,999 | B2 * | 3/2010 | Back et al. | 362/97.2 |
| 7,682,043 | B2 * | 3/2010 | Malstrom et al. | 362/249.11 |
| 7,686,477 | B2 * | 3/2010 | Southard et al. | 362/249.04 |
| 7,694,444 | B2 * | 4/2010 | Miller et al. | 40/446 |
| 7,697,087 | B2 * | 4/2010 | Chang | 349/61 |
| 7,699,484 | B2 * | 4/2010 | Teng | 362/97.3 |
| 7,708,615 | B2 * | 5/2010 | Munch | 446/91 |
| 7,721,475 | B2 * | 5/2010 | Chiang et al. | 40/541 |
| 7,740,365 | B2 * | 6/2010 | Huttner et al. | 362/97.3 |
| 7,926,976 | B2 * | 4/2011 | Schinzel-Kolb et al. | 362/249.02 |
| 8,070,325 | B2 | 12/2011 | Zampini et al. | |
| 8,167,465 | B2 | 5/2012 | Cha | |
| 8,226,280 | B2 | 7/2012 | Daily et al. | |
| 8,599,104 | B2 | 12/2013 | Gardner | |
| 8,613,524 | B2 | 12/2013 | Sekela et al. | |
| 8,696,162 | B2 | 4/2014 | Wendt | |
| 2003/0031032 | A1 * | 2/2003 | Wu et al. | 362/564 |
| 2003/0063463 | A1 * | 4/2003 | Sloan et al. | 362/238 |
| 2003/0217495 | A1 * | 11/2003 | Nagamine et al. | 40/605 |
| 2003/0218878 | A1 * | 11/2003 | Swaris et al. | 362/234 |
| 2004/0223319 | A1 * | 11/2004 | Chou et al. | 362/97 |
| 2004/0262472 | A1 * | 12/2004 | Thomas | 248/220.21 |
| 2005/0122293 | A1 * | 6/2005 | Wang | 345/84 |
| 2005/0207151 | A1 * | 9/2005 | Aanegola et al. | 362/227 |
| 2005/0231935 | A1 * | 10/2005 | Kimmet et al. | 362/29 |
| 2005/0231943 | A1 * | 10/2005 | Sloan et al. | 362/219 |
| 2006/0028837 | A1 * | 2/2006 | Mrakovich | 362/602 |
| 2006/0221612 | A1 * | 10/2006 | Song et al. | 362/247 |
| 2006/0232969 | A1 * | 10/2006 | Bogner et al. | 362/252 |
| 2008/0024696 | A1 * | 1/2008 | Arai et al. | 349/62 |
| 2009/0059619 | A1 * | 3/2009 | Uemoto | 362/609 |
| 2009/0073693 | A1 | 3/2009 | Nall et al. | |
| 2009/0109655 | A1 * | 4/2009 | Shinozaki | 362/97.1 |
| 2009/0213575 | A1 * | 8/2009 | Blumel et al. | 362/97.3 |
| 2009/0267493 | A1 * | 10/2009 | Suh et al. | 313/504 |
| 2009/0316389 | A1 * | 12/2009 | Park et al. | 362/97.1 |
| 2010/0033953 | A1 * | 2/2010 | Tien et al. | 362/97.1 |
| 2010/0103651 | A1 * | 4/2010 | Park | 362/97.1 |

* cited by examiner

LED BACKLIGHT SYSTEM FOR CABINET SIGN

RELATED APPLICATION

This application is a continuation of U.S. patent application Ser. No. 11/784,639, filed on Apr. 9, 2007, which claimed the benefit of U.S. Provisional Patent Application Ser. No. 60/849,653, filed on Oct. 5, 2006. These applications are incorporated herein by reference in their entireties.

BACKGROUND

The present exemplary embodiments relate to a backlighting system. It finds particular application in conjunction with the signage industry. One particular application for such a backlighting system is a cabinet sign, and it will be described with particular reference thereto. However, it is to be appreciated that the present exemplary embodiment is also amenable to other like applications.

Presently large cabinet signs currently use fluorescent bulbs and ballast as the lighting system. These types of systems are labor intensive and costly to maintain. Often the bulbs need to be replaced within a year or two at most. Given a typical location of the cabinet sign and the size of the bulbs, frequently the use of a bucket truck or other non-readily available equipment is needed to repair the sign. Previously proposed alternatives for a backlighting system for a cabinet sign include a linear light emitting diode array or a perimeter lighting apparatus. However, for various reasons, these options have not obtained any significant commercial success as an alternative to the aforementioned fluorescent backlighting system.

BRIEF DESCRIPTION

A backlighting system for a cabinet sign is described herein and a method of making the sign. The system may include a plurality of panels. Each panel includes a plurality of light emitting diodes ("LEDs") attached to the panel. The LED layout spacing pattern has a box sign depth factor of less than about 1.4. An integrated circuit may also be located on the panel. A wire physically connects adjacent panels. Cabinet signs which include the aforementioned back lighting system are also disclosed herein.

DETAILED DESCRIPTION

In describing the various embodiments of the backlighting system, like elements of each embodiment are described through the use of the same or similar reference numbers.

An embodiment disclosed here includes a plurality of panels which comprise the backlighting system. Each panel includes a plurality of LEDs. Preferably, the LEDs are spaced away from each other on the same panel and likewise relative to LEDs on adjacent panels such that the backlighting system will exhibit lighting qualities similar to those of a fluorescent backlit system. The LED backlit system will exhibit uniformity, brightness, and color rendering consistent with that of a fluorescent backlit system.

Figure 1:
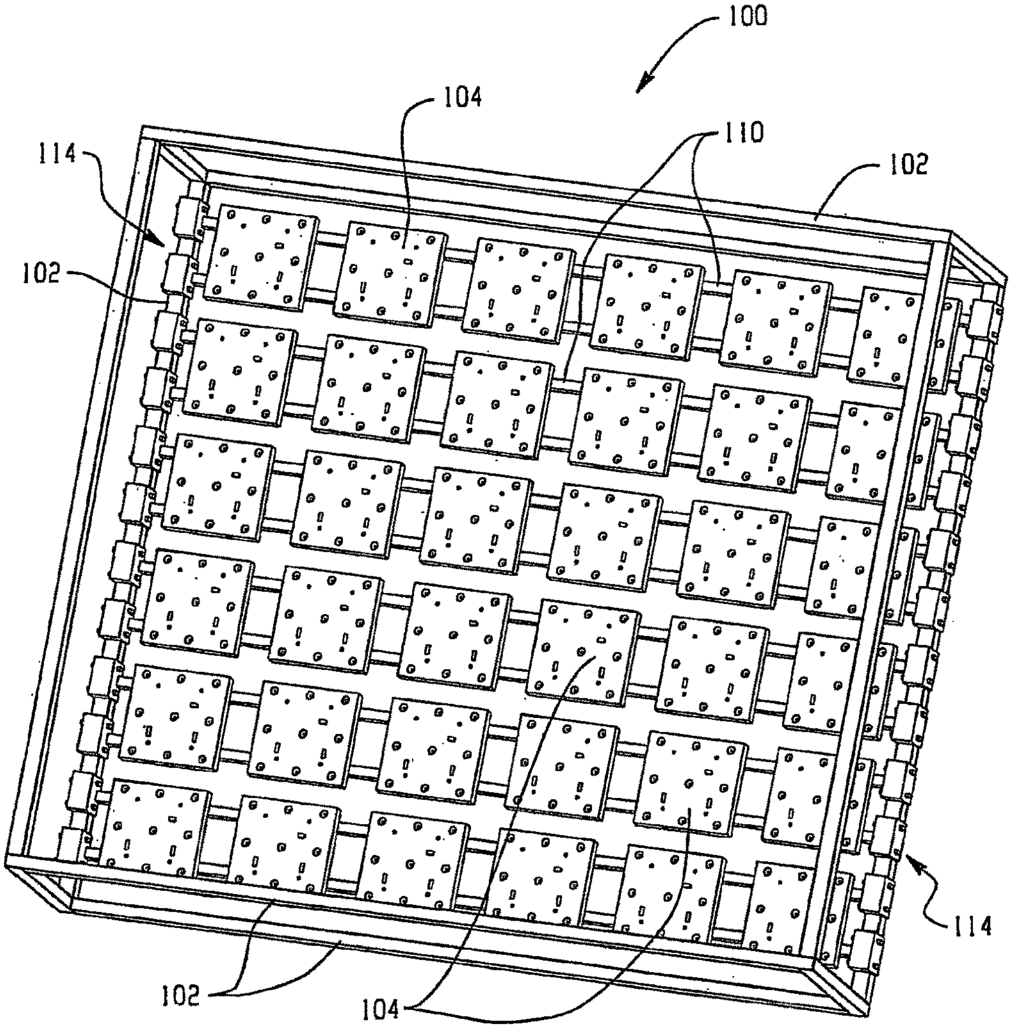
FIG. 1 is a front view of one embodiment of a backlighting system for a cabinet sign described herein.

With reference to FIG. 1, illustrated is a front view of a backlighting system, 100, for a cabinet sign. The depicted system 100 includes a frame 102 and a plurality of panels 104. Panels 104 are attached to frame 102 in a plurality of rows as shown. Alternatively, panels 104 may be attached to frame 102 in plurality of columns instead of rows. Individual panels 104 are not limited to any particular size. Given that typically a box sign is square or rectangular, a particular useful panel size is 1'x1'. Manufacturers of cabinet signs may find this size panel desirable in that it may be used to make the lighting system for cabinet signs of various sizes. Typically, the cabinet sign has a sign surface having an area of the sign less than about 200 square feet ($ft^2$). In various embodiments of the sign, the surface area of the sign may range from about 4 up to about 200 square feet ($ft^2$). Alternatively, if a flexible material (e.g., a vinyl based material, etc.) is employed for the face of the cabinet, the surface area of the sign can be much greater than 200 square feet. Such an approach can be employed to allow the cabinet face to withstand excessive wind loading.

Figure 11:
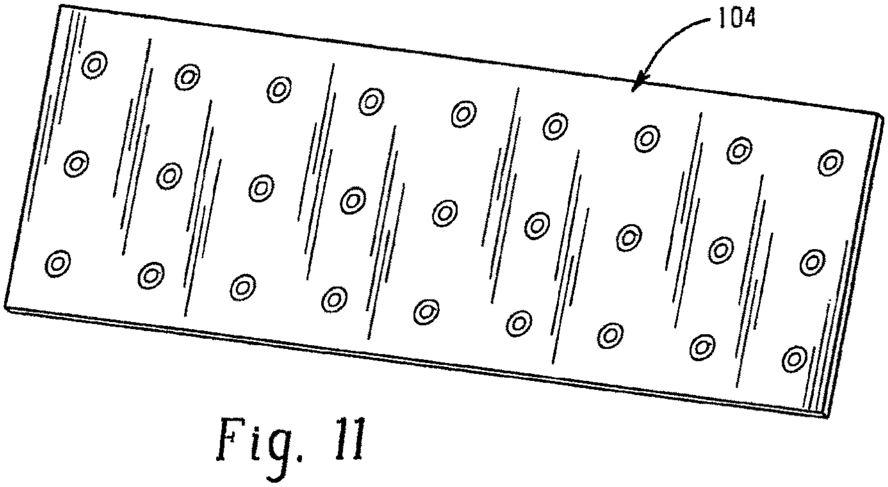
FIG. 11 is a front view of another embodiment of a panel which may be used in the backlighting system disclosed herein.

Alternatively, as shown in FIG. 11, panels 104 may be rectangular in shape. Panels 104 are not limited to any particular shape or size. Panels 104 are depicted in rectangular and square shapes due to the reason that these are believed to be desirable shapes for sign manufacturers. Panels having other shapes may be manufactured, if desired by an end user. Also, panels of different shapes and/or sizes may be used in the same cabinet sign.

In one embodiment, panel 104 may be a printed wiring board. The printed wiring board may be one selected from the group of a printed circuit board, a metal clad printed circuit board, and a flexible circuit. The flexible circuit may include a backing plate. Two examples of preferred materials for the backing plate include aluminum or plastic. Flex circuits are available at least from the following sources: Minco of Minneapolis, Minn., Allflex Inc. of Northfield, Minn., and Uniflex Circuits of San Jose, Calif. In another embodiment, the printed wiring board may include LEDs connected together with a wire in the form of a strip and then the strip is attached to a backing. Typically, the backing may be made of aluminum or plastic.

Figure 2:
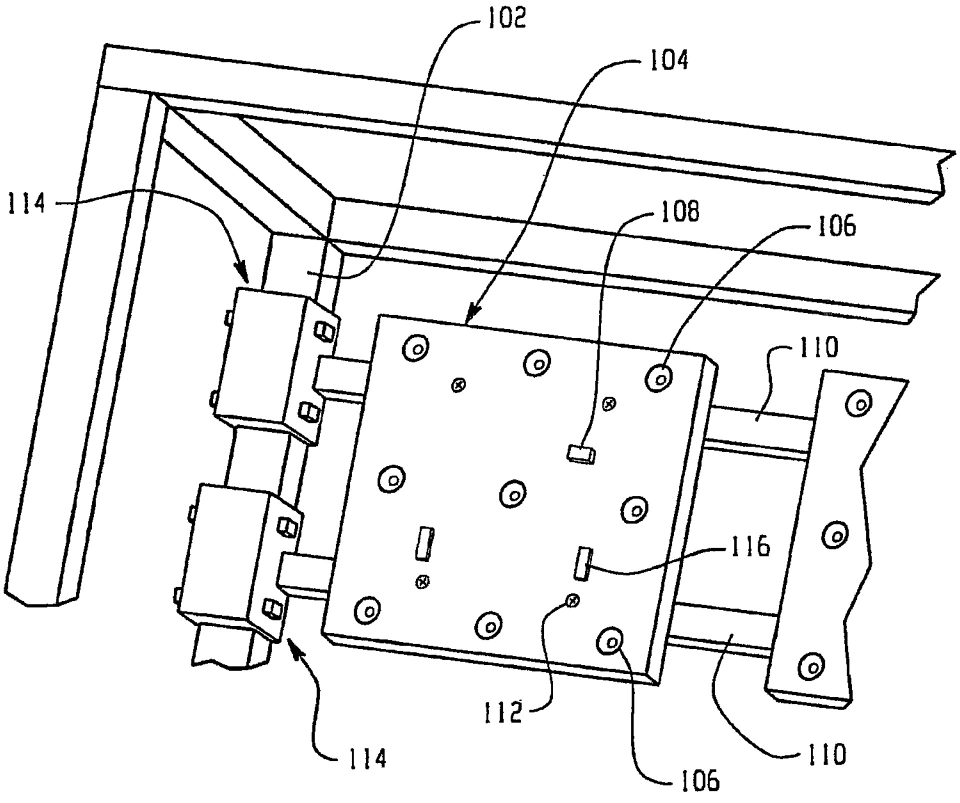
FIG. 2 is a front view of a panel which may be used as part of the backlighting system as described herein.

As shown in FIG. 2, each panel 104 includes a plurality of light emitting diodes ("LEDs") 106. LEDs 106 may be arranged in any particular pattern on panel 104. Also, the number of LEDs 106 on each panel may vary or may be uniform. In one particular embodiment, each LED 106 is no more than 4" away from one or more adjacent LEDs. In another embodiment, LED spacing may be determined by the box sign depth factor. This is the ratio of the distance the LED is from the sign face of the cabinet sign ("depth") divided by the distance between the closest adjacent LED and the subject LED. For example, if the subject LED is 4"away from the closest adjacent LED and the depth of the LED below the sign is 4", the factor is 1. In another example if the distance between adjacent LEDs remains the same, but, the depth changes to 5", the factor is 1.25. In a further example, adjacent LEDs are spaced about 6" away from each other and the depth is about 8", the sign box depth factor is about 1.33.

In a particular embodiment, a preferred factor is less than about 1.4. In another particular embodiment, the factor may range from about 1.25 to about 0.5. In a further embodiment, the LEDs may be randomly or uniformly spaced apart from one another. In one certain embodiment, each LED is substantially equally spaced apart from its adjacent LEDs.

Any suitable type of LED may be used in conjunction with the panel 104. Examples of typical types of LEDs which may be used include surface mount LEDs and hole through LEDs. Panel 104 is not limited to a particular number of LEDs 106. Any desired number of LEDs may be used. A typical panel 104 may have anywhere from four (4) to twelve (12) LEDs associated with it.

In addition to various types of LEDs being suitable, LEDs 106 do not have to have any specific wattage requirement. In one particular application LED 106 wattage may be 1 W or 0.5 W. As for panel 104, in one particular embodiment it is preferred that the light emitted by LEDs 106 on panel 104 has a brightness of up to about 1500 nits, measured at the outside surface of the sign face of the sign.

Panel 104 may also include one or more integrated circuits 108. Integrated circuits 108 may be used to drive LEDs 106 on panel 104. In addition to panel 104 including circuit 108, panel 104 may include one or more LED protective elements. This is an element which may protect the diode of the LED from coming in physical contact with another tangible item. In one example, the protective element may comprise a ring shaped cone on the surface of panel 104 in which LED 106 is in the center of the recessed portion of the cone. In a second embodiment, the protective element may be a clear plastic cap over the top of the diode of each LED.

Also illustrated in FIG. 2, panels 104 may be attached to one or more rails 110. The rails may be constructed from any material which is known to be suitable for use as a heat sink; non-limiting examples include aluminum and natural graphite. Panels 104 may be attached by any know attachment technique. As illustrated panels 104 are attached by the use of screws 112. Optionally, panels 104 may be fixed to rails 110 or adjustably attached to rails 110, as shown. Rails 110 may be attached to frame 102 by any known attachment technique. In another embodiment, panels 104 may include one or more integral or attachable guides that mate with a portion of rails 110 and enable panels 104 to easily move along rails 110.

As illustrated, rails 110 may be adjustably attached to frame 102 by the use of a clamping element, 114. Alternatively, other adjustable attachment elements may be used instead of clamping element 114 or fixed attachment elements may be used in place of clamping element 114. Panels 104 may be uniformly spaced apart or randomly spaced apart. In one particular embodiment, the spacing between any two adjustably attached adjacent panels 104 on the same rail 110 may be adjusted to a desired distance. Panel 104 may also include one or more terminals 116. The terminals may be used to connect two (2) adjacent panels 104 together.

Figure 3:
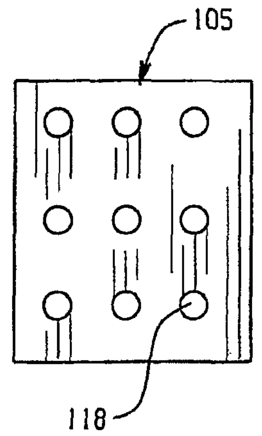
FIG. 3 is a front view of a core plate which may be included as part of a panel.

Depicted in FIG. 3 is a front view of one embodiment of an optional component of panel 104. As illustrated panel 104 may include a core plate 105. Optionally, core plate 105 includes one or more openings 118. Preferably, openings 118 are sized and spaced so not to detract from the structural integrity of panel 104 but to improve at least the ability of panel 104 to transfer heat away from the LEDs and optionally also the strength of core plate 105. Openings 118 may be uniformly or randomly oriented on panel 104. Examples of preferable materials of construction of core plate 105 include steel, steel alloys, aluminum, aluminum alloys, natural graphite, extruded plastic, any other material which may be used as a heat sink and have sufficient structural integrity, and combinations thereof.

Figure 4:
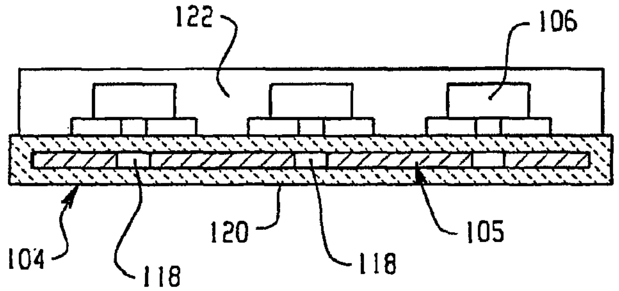
FIGS. 4 and 5 are side views of a panel which include an over mold.
Figure 5:
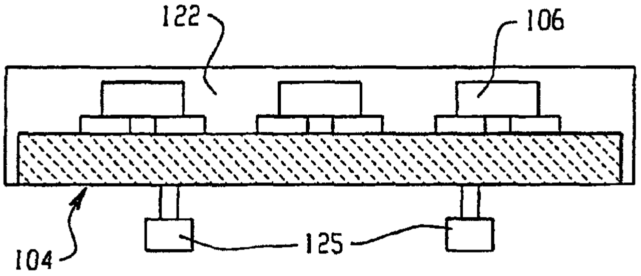
Figure 7:
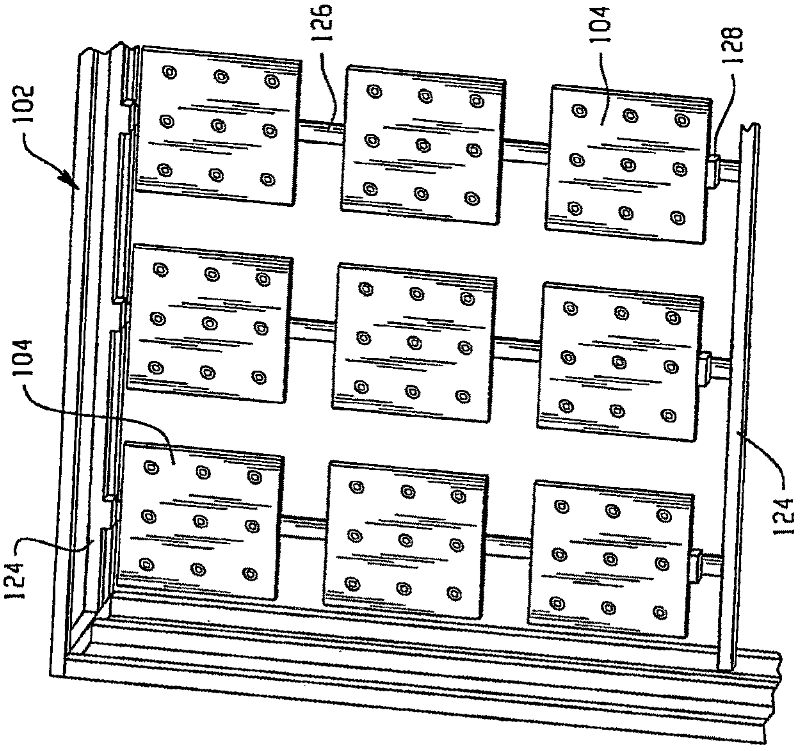
FIG. 7 is an embodiment of a backlighting system described herein along with the frame of the cabinet sign.
Figure 6:
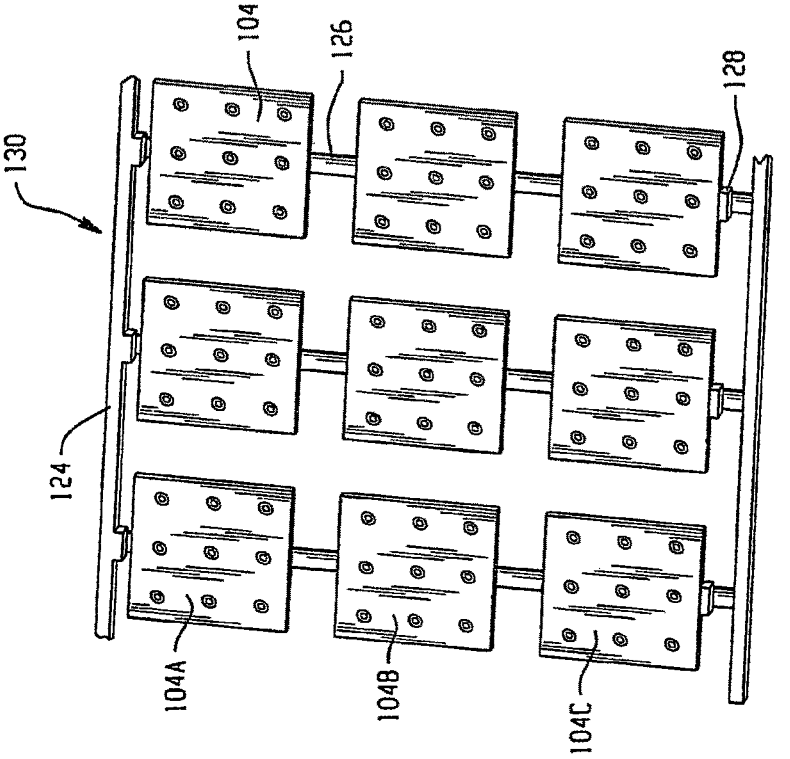
FIG. 6 is a front view of another embodiment of the backlighting system.

As shown in FIG. 4, panel 104 may include a thin ceramic coat 120 encapsulating core plate 105. Panel 104 may also include an over mold 122. Preferably, over mold 122 is made from weather resilient material and has a transparent top surface. Examples of materials which may be used to make over mold 122 include silicone, epoxy, or a plastic extrusion. The plastic extrusion may be formed from thermoplastic elastomers (thermoconductive or non thermo-conductive), polyvinyl chloride, acrylic, polyethylene (high density or low density), polypropylene, polystyrene, and ABS. Over mold 122 may attach to a top surface of panel 104 or alternatively may attach to a side or bottom surface of panel 104, as shown in FIG. 5. Additionally, panel 104 may include one or more optional feet 125. Preferably feet 125 extend away from panel 104 from an underside of panel 104. Preferably, over mold 122 does not cover a top surface of LEDs 106.

Specific preferred combinations of panel 104 and over mold 122 include a printed circuit board panel and a plastic or silicone over mold, a metal clad circuit board and a plastic or silicone over mold, and a flex circuit on an aluminum or plastic backing and a plastic or silicone over mold. The plastic may be a thermoplastic elastomer or other type of suitable polymer which may be formed into plastic.

In one method of applying over mold material to panel 104, panel 104 may include openings and pins may be used to maintain panel 104 in a fixed position during the over molding process. If desired in a second embodiment, the openings used may be filled in a separate over molding step or the holes may be filled with a filler.

Alternatively, panels 104 may be encased in a snap together plastic housing. The housing may include connecting front and back sections which may be used as an enclosure to protect the board. It is preferred that the front section of housing includes openings aligned with LEDs 106 for the emission of the light generated by LEDs 106.

Figure 10:
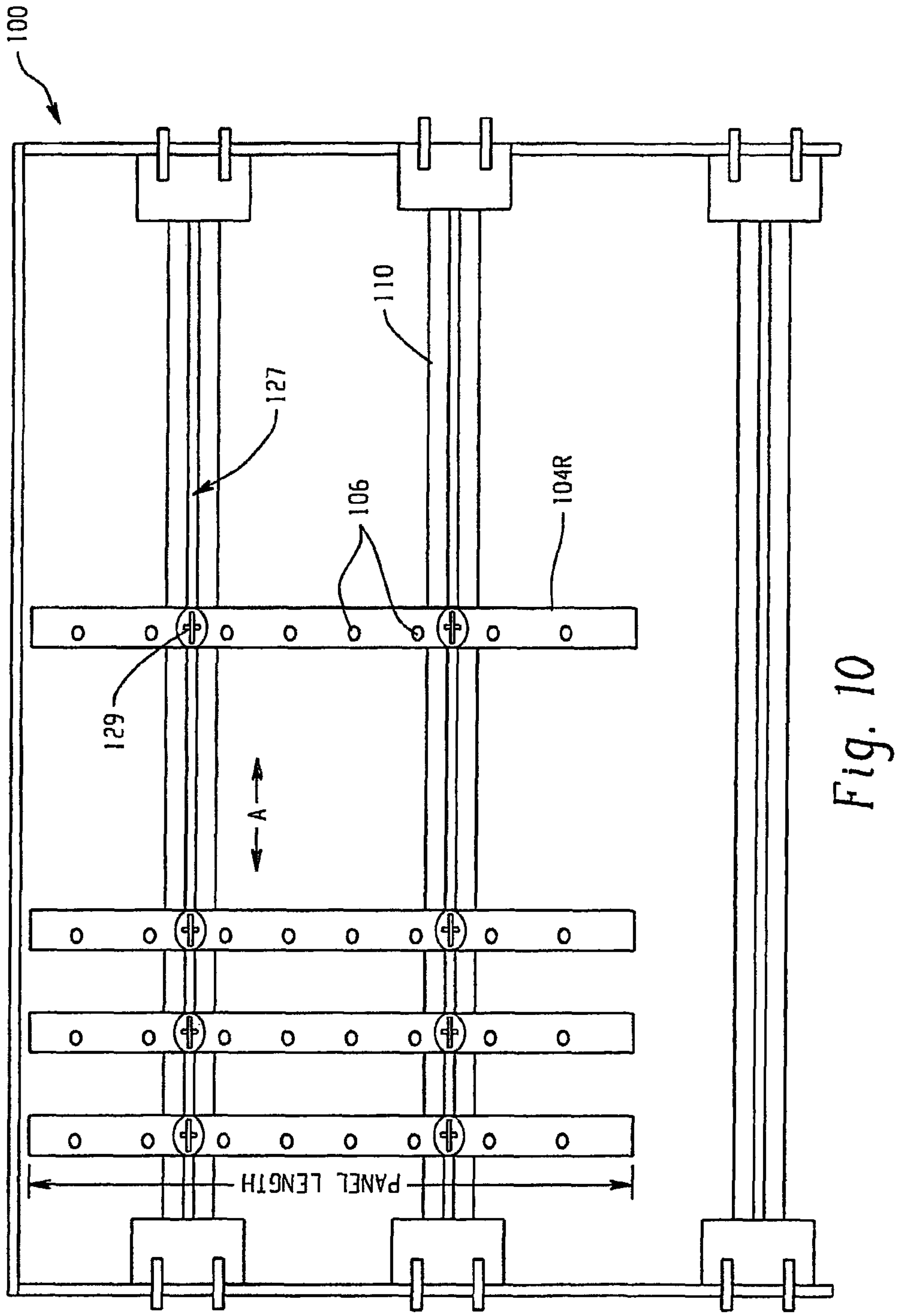
FIG. 10 is another embodiment of the backlighting system which includes a rectangular embodiment of the panels.

Over mold 122 or the housing may be used to connect a plurality of panels 104 having a one-dimensional array to form a panel having a two-dimensional array. For example, two or more panels, such as shown in FIG. 10, 104R may be over molded at the same time to form a composite panel having the LEDs arranged in two dimensions. The resulting panel would have an orientation similar to that of the panel 104L, shown in FIG. 12. Alternatively, a housing may be used to form a plurality of panels 104R having a one-dimensional array into a two-dimensional array. Such a housing would encase two or more panels to align LEDs 106 in the width and length direction of the housing.

Figure 8:
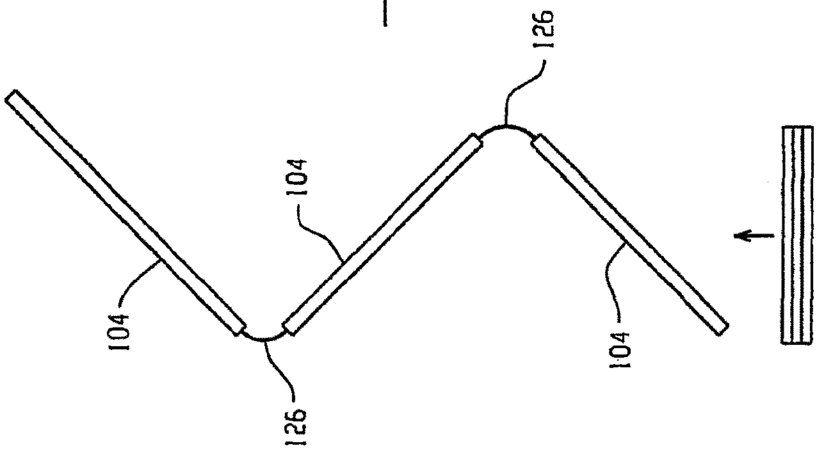
FIG. 8 is a side view of an embodiment of a column of panels which are foldable.
Figure 13:
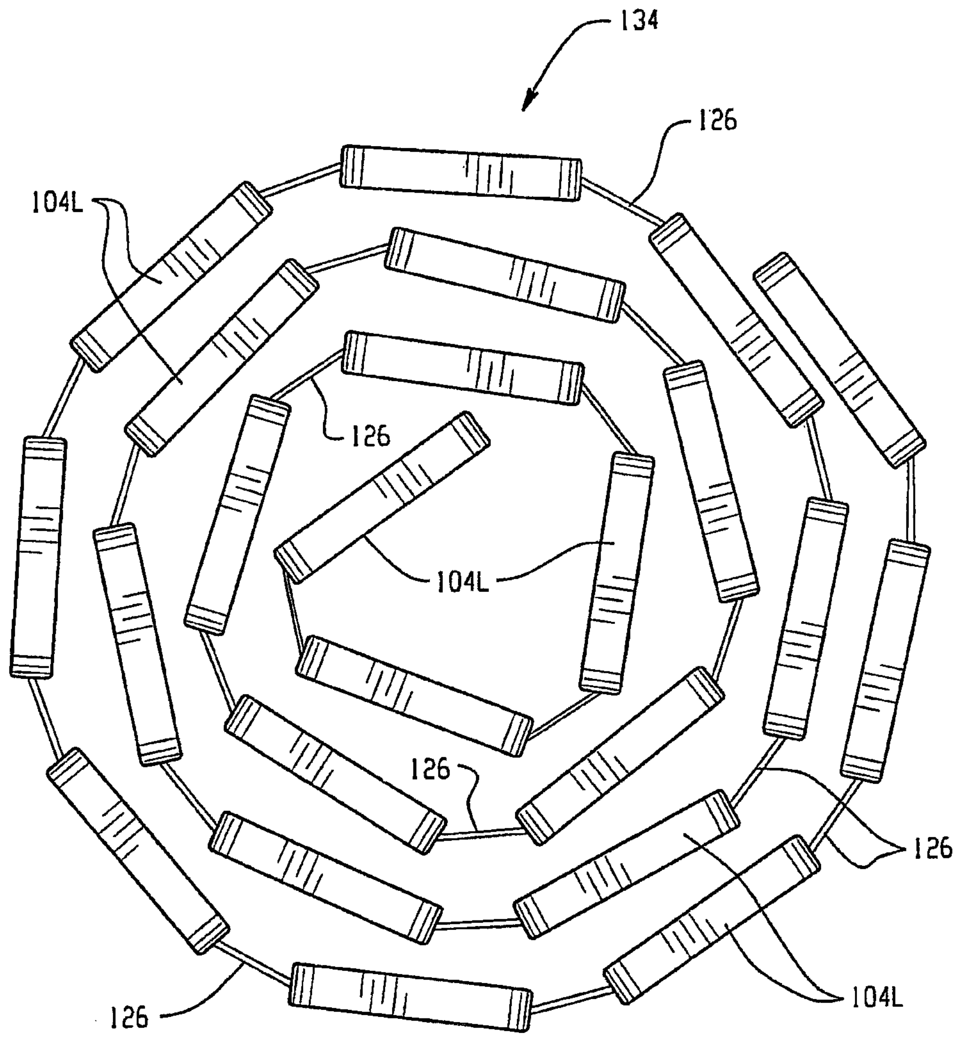
FIG. 13 is an embodiment of a column of panels as shown in FIG. 12 which are rolled into an easily packagable shape.
Figure 13A:
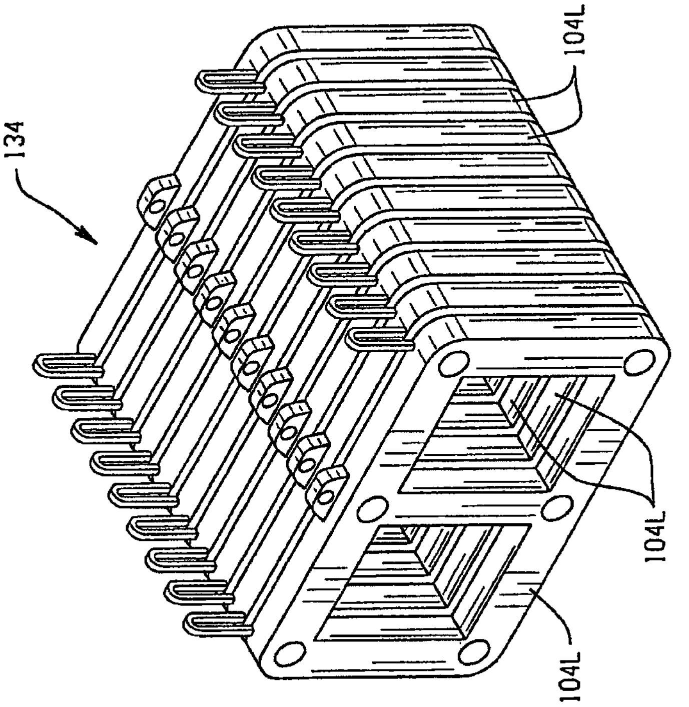
FIG. 13A is an embodiment of a column of panels as shown in FIG. 12 which are folded one on top of another.

An arrangement 130 of panels 104 is illustrated in FIGS. 6 to 9. As shown, a plurality of panels 104 is arranged in columns. Adjacent panels 104 in each column are attached by one or more flexible strips 126. Preferably flexible strips 126 mechanically connect adjacent panels 104. Optionally, flexible strips 126 may also electrically connect adjacent panels 104. Preferably flexible strips 126 have sufficient flexibility that strips 126 may be used to fold panels 104 of system 100 one on top of another, as illustrated in FIG. 8. In one particular embodiment, panels 104 may be shipped in the folded orientation as shown in FIG. 13A. In the embodiment shown in FIG. 6, one fold may occur between row 104A of panels 104 and row 1048 of panels 104 and another fold may occur between row 104B of panels 104 and row 104C of panels 104. As shown, a connector 128 is used to attach the end panel 104 of each column to a support 124. Two non-limiting examples of suitable materials for flexible strip 126 are a ribbon cable and a Mylar flex connection. These exemplary materials may also be used to supply power between adjacent panels. In the case that strip 126 includes a wire, the wire may optionally be either a two conductor wire or a three conductor wire.

Figure 9:
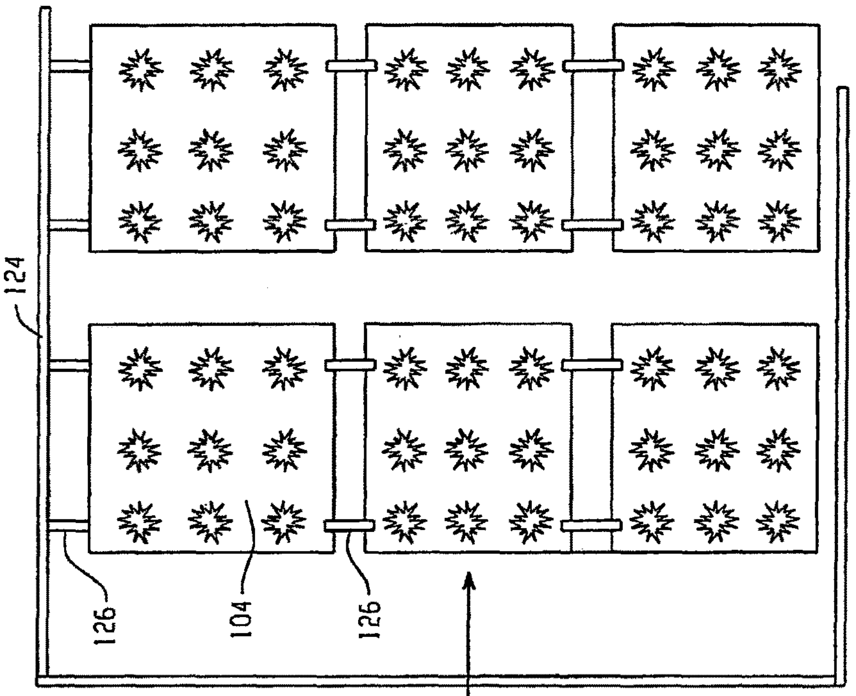
FIG. 9 is a partial view of a backlighting system which includes the foldable column of panels from FIG. 8.

Supports 124 may be attached to frame 102 of a cabinet sign. One or more of the arrangements 130 may be used to form the system 100 for a cabinet sign. Alternatively, as shown in FIG. 9, flexible strips 126 may be used to attach panels 104 to support 124. In another alternate embodiment, flexible strips 126 may be used to attach panels 104 to frame 102 instead of support 124.

An alternate embodiment of panels 104R is depicted in FIG. 10. In FIG. 10, panel 104R has a rectangular shape and LEDs 106 are arranged in a single file line along the length of panel 104R. This may also be referred to as arranging LEDs 106 in a one dimensional pattern, whereas in FIG. 2, LEDs 106 are arranged in a 2-dimensional pattern.

As shown in FIG. 10, panels 104R may be moved in the direction of double arrow A along rails 110 to any desired point along rails 110. In the illustrated embodiment, each rail 110 includes a recess to engage a locking element 129. As shown locking element 129 includes a bolt sized to fit into recess 127. In an alternate embodiment, recess 127 may be sized to engage the feet of panel 104R similar, but not limited, to feet 125 depicted in FIG. 5.

Figure 14:
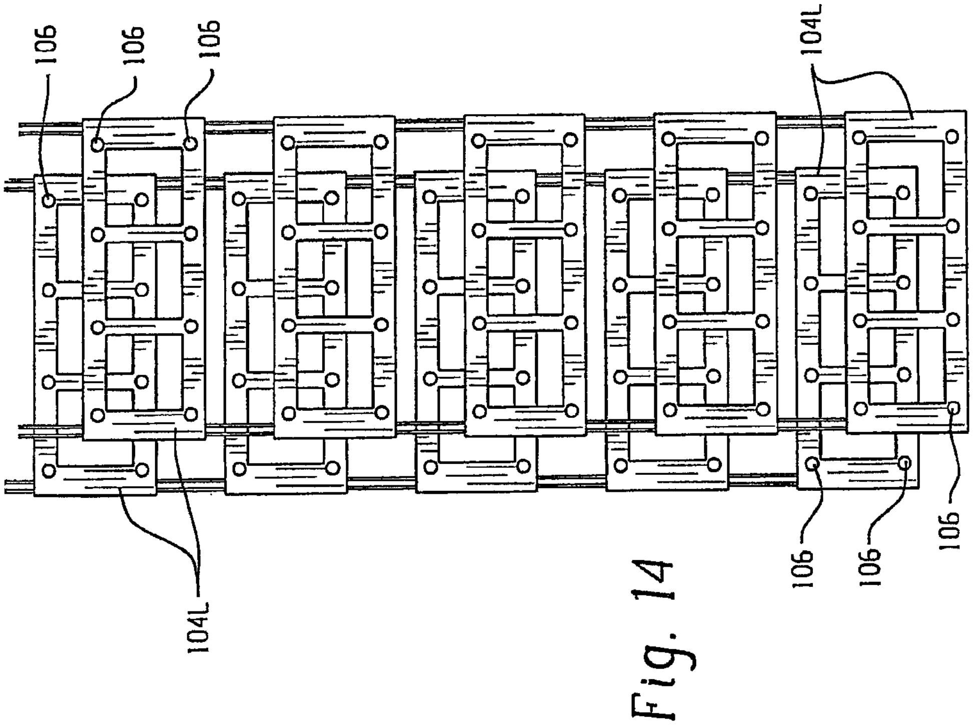
FIG. 14 is an embodiment of two columns of panels which are stacked one column on top of another column.

Each pair of panels 104R may include a bracket in between adjacent panels 104R. The bracket may be a unitary element which connects two adjacent panels 104R. Each panel 104R may include a receiving element for the bracket. Additionally, the bracket may have a recess such that it will be able to receive another panel 104R to align a plurality of panels in a manner similar to as shown in FIG. 14. Alternatively, a portion of the bracket may be attached to each of the panels 104R and mate with a complimentary portion of the bracket on the adjacent panel 104R. Also, the bracket may include a hinge such that a fold may be formed relative to the two adjacent panels. Lastly, the brackets may be detachable; such that the bracket may be detached from a panel or that the bracket may be separated into two (2) sections.

Optionally, one end of panels 104R may include a port for connecting a power source to panel 104R. A second end of the panel 104R may include an electrical connector to adjoin adjacent panels 104R in the horizontal direction of the backlighting system.

Figure 12:
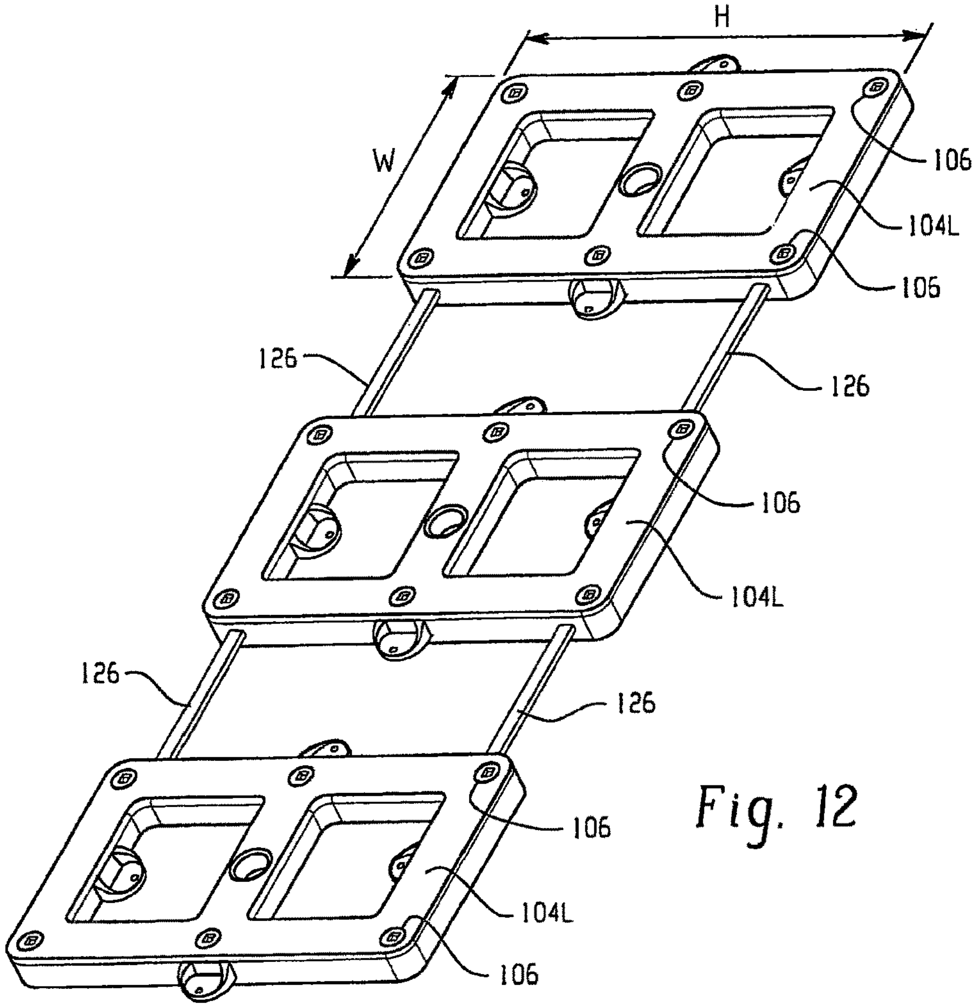
FIG. 12 is a column of the panels disclosed herein.

Illustrated in FIG. 12 is another embodiment of panel in the form of a lattice 104L. Panel 104L may be any desired dimension, such as but not limited to about twelve inches (12") wide (depicted as "W") and a height of about four inches (4") to about six inches (6") (depicted as "H"). Preferably the LEDs 106 are spaced at least about two inches (2"), but no more than six inches (6"), apart from an adjacent LED 106. Preferably, adjacent panels 104L are connected by flexible strips 126. Optionally, panels 104L may be connected to a bus, not shown. It is also preferred that the plurality 134 of panels 104L may be folded one on top of the other as shown in FIG. 13A, or rolled into a convenient shape of packaging and transporting to a desired location. As shown, one convenient shape is the substantially cylindrical type shaped roll of the plurality 134 illustrated in FIG. 13.

In one particular embodiment of system 100 that includes panels 104L, it is preferred that the LEDs 106 are equally spaced apart from one another, For example, each LED may be about four inches (4") apart for an adjacent LED. Optionally, the 4" spacing may also apply to adjacent LEDs 106 on adjacent panels 104L. Adjacent panels 104L may be arranged either horizontally or vertically to one another. Dimensions of a panel, long on one side (e.g., nine inches), short on the other (e.g., less than five inches) can provide easier fit within rectangular cabinet sign and, by adjusting orientation of layout, may accommodate a greater number of box signs of varying heights and widths.

In another embodiment of system 100 which includes panels 104L, panels 104L may be stacked one on top of another as shown in FIG. 14. In one particular embodiment, it is preferred that the panels 104L are stacked in an offset relationship to one another such that the light emitting from those LEDs 106 on a lower panel 104L is not blocked by the upper panel 104L. This technique may be used to increase the density of the LEDs in a particular area of the cabinet sign or over all of the illumination areas of the cabinet sign. Panels 104L may be arranged in a stacked configuration by various techniques, such as rails, wire supports, or snap-on features. A bottom surface of a top one of panels 104L may have a snap-on element and the top surface of the lower panel 104L may have a complimentary snap-on element. Optionally, one or more of panels 104L may include a stand-off. The stand-off may be integral or attached to panel 104L. In one embodiment of stacked panels 104L, it is preferred that panels 104L do not contact one another. In this embodiment, the stand-off may include a small piece of plastic which is used to maintain a preferred distance between the upper and bottom panels 104L.

Figure 31A:
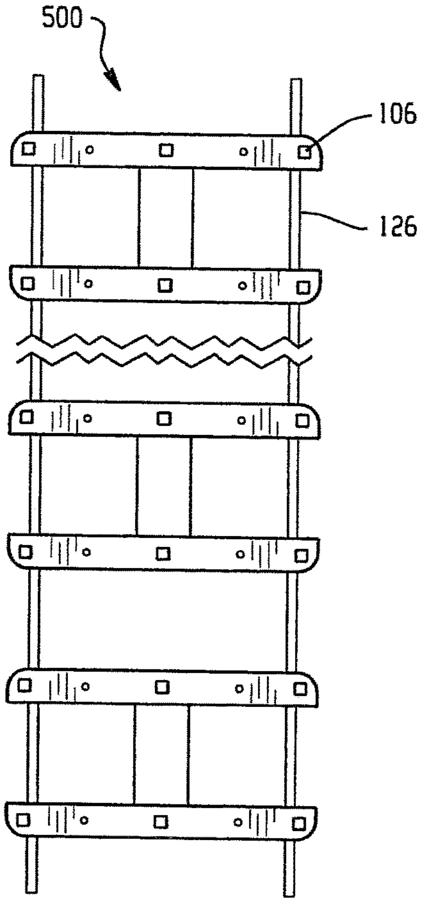
FIG. 31A illustrates a top view of the LED panel in the form of a lattice, in accordance with an exemplary embodiment.
Figure 31B:
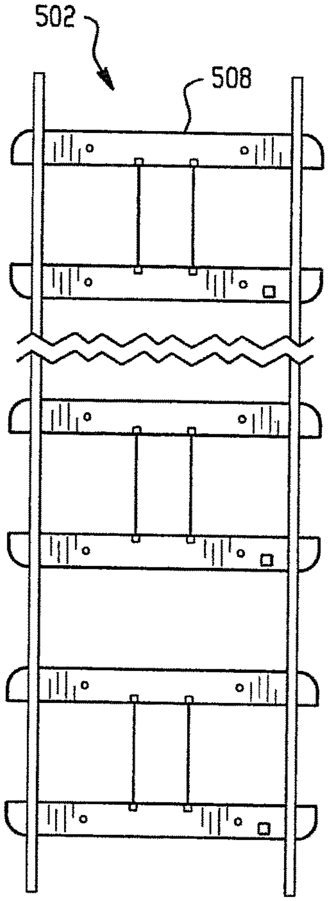
FIG. 31B illustrates a bottom view of an LED panel in the form of a lattice, in accordance with an exemplary embodiment.
Figure 32:
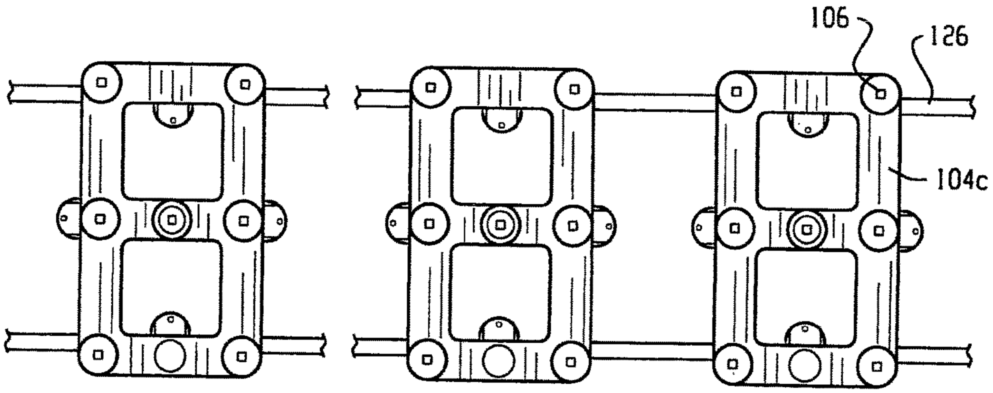
FIG. 32 illustrates a top view of an over mold LED module in the form of a lattice, in accordance with an exemplary embodiment.
Figure 33C:
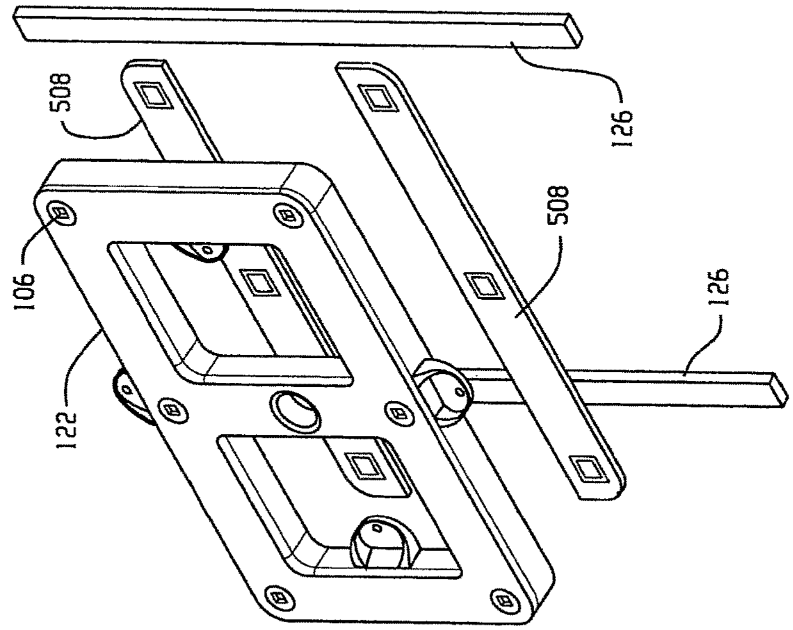
FIG. 33C illustrates an exploded view of an LED module in the form of a lattice, in accordance with an exemplary embodiment.
Figure 33A:
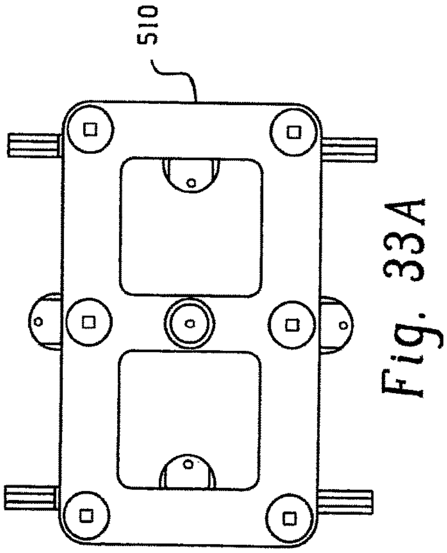
FIG. 33A illustrates a top view of an LED module in the form of a lattice, in accordance with an exemplary embodiment.
Figure 33B:
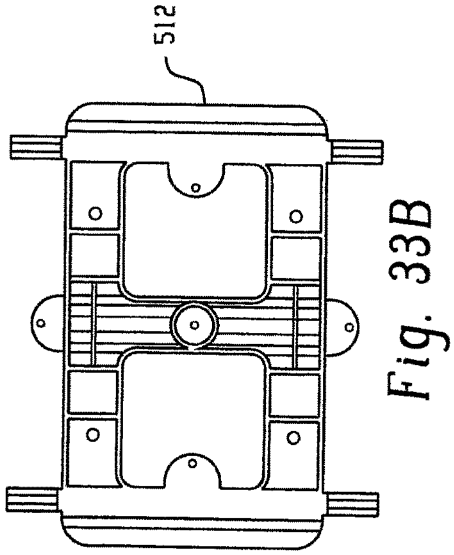
FIG. 33B illustrates a bottom view of an LED module in the form of a lattice, in accordance with an exemplary embodiment.
Figure 34A:
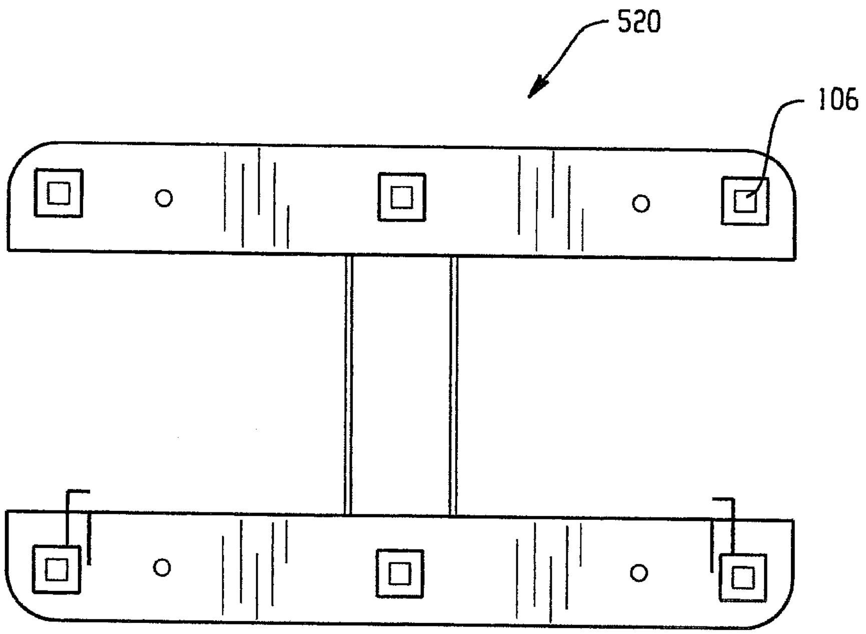
FIG. 34A illustrates a top view of a PCB assembly utilized with an LED panel, in accordance with an exemplary embodiment.
Figure 34B:
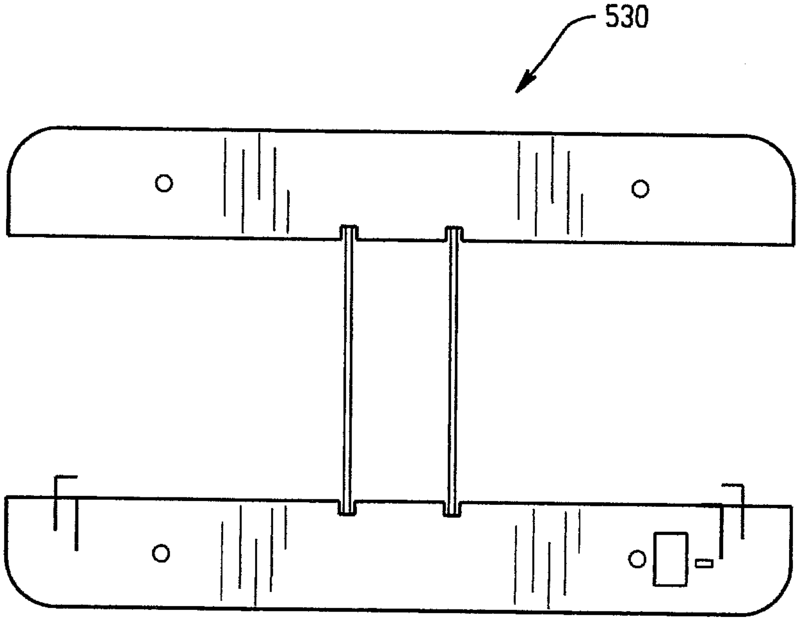
FIG. 34B illustrates a bottom view of the PCB assembly utilized with an LED panel, in accordance with an exemplary embodiment.

FIGS. 31A and 31B show a top view 500 and bottom view 502 of a PCB assembly 508 utilized in the lattice LED panel 104L. FIG. 32 shows a top view of a plurality of lattice LED panels 104L as illustrated in FIG. 12 above. FIG. 33A illustrates a top view and FIG. 33B illustrates a bottom of view of the over mold 122. FIG. 33C illustrates an exploded view of the over mold 122 with the PCB assembly 508 and the flexible strips 126. FIGS. 34A and 34B illustrate top and bottom views 520 and 530 of the PCB assembly 508 shown in FIGS. 31A and 31B above.

Figure 15:
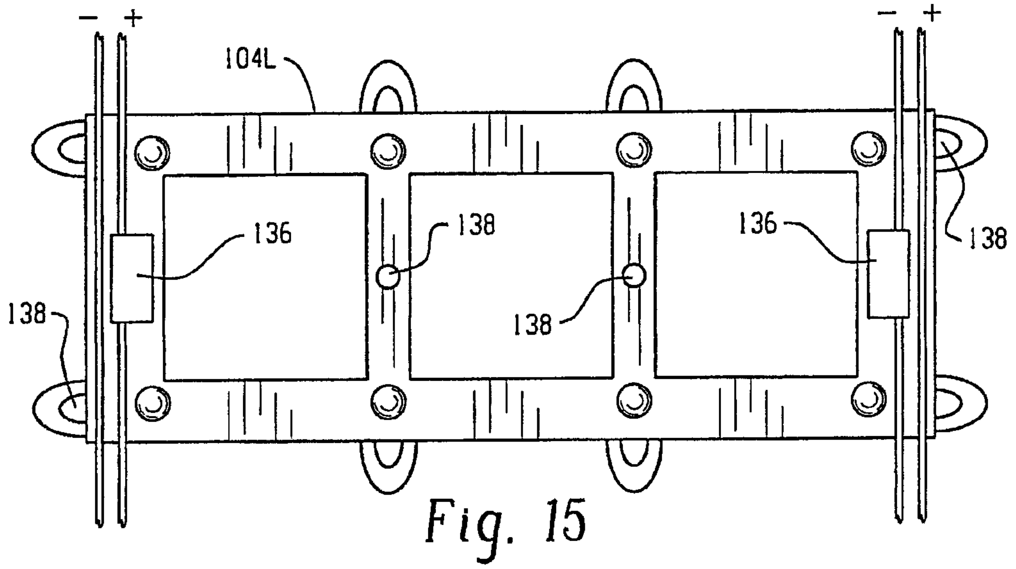
FIG. 15 is an additional embodiment of a panel.
Figure 16:
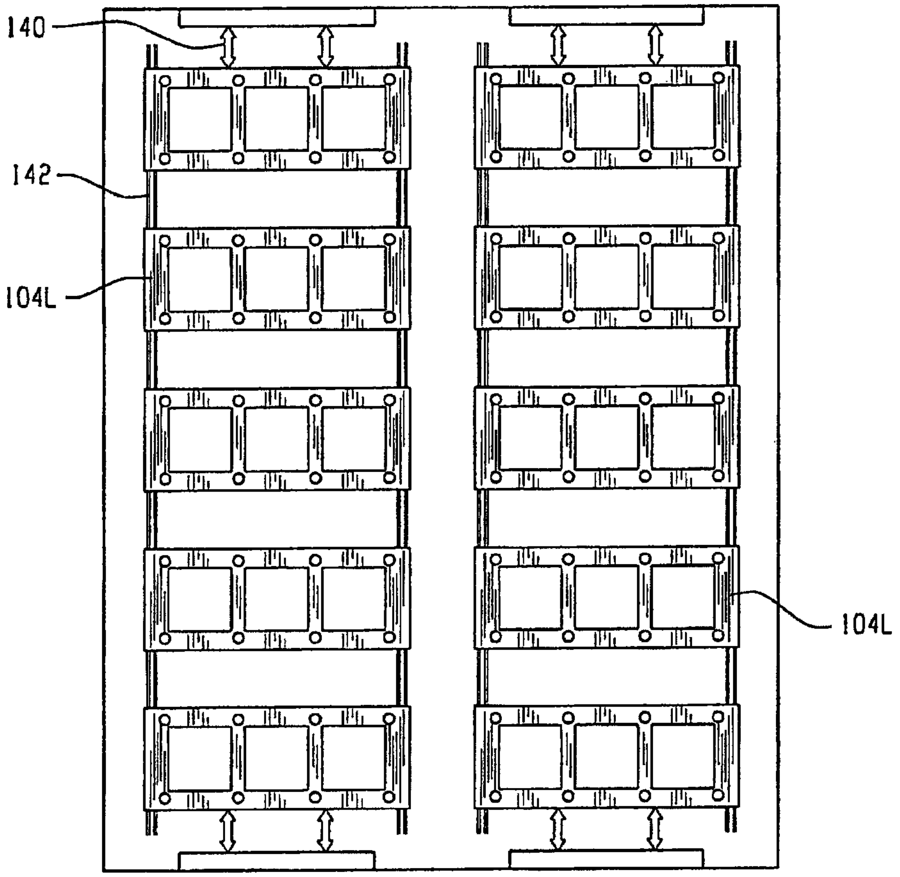
FIGS. 16-19 depict alternatives how power may be supplied to a panel as well as between panels in the same column and between different columns of panels.
Figure 17:
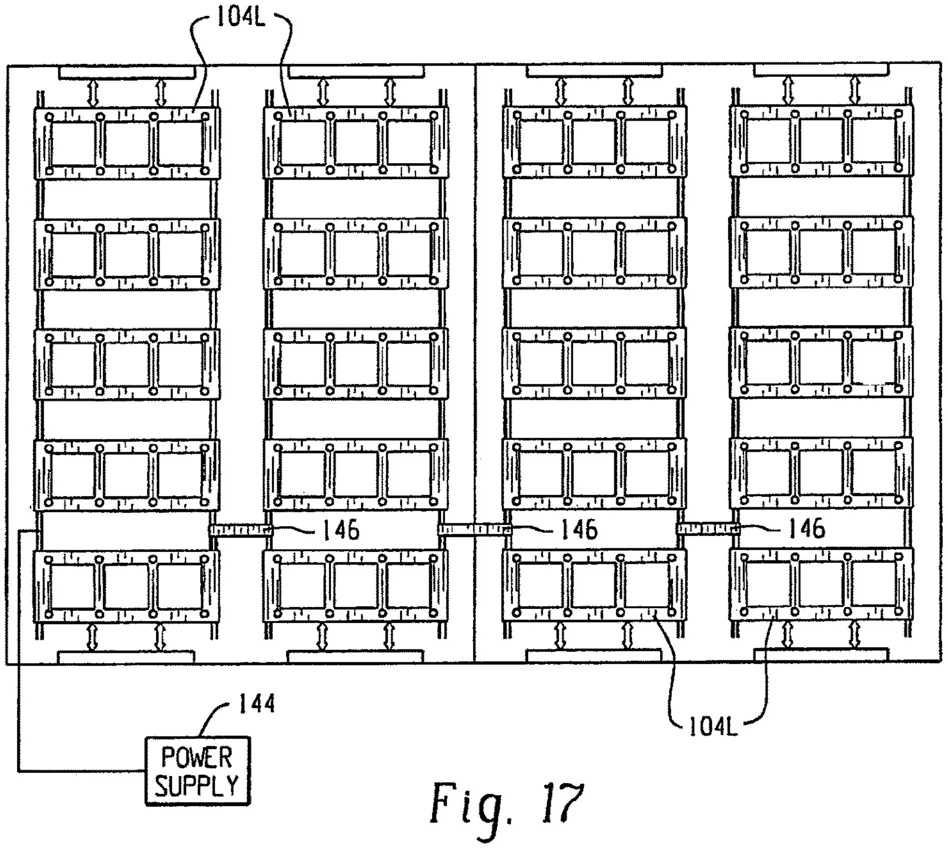
Figure 18:
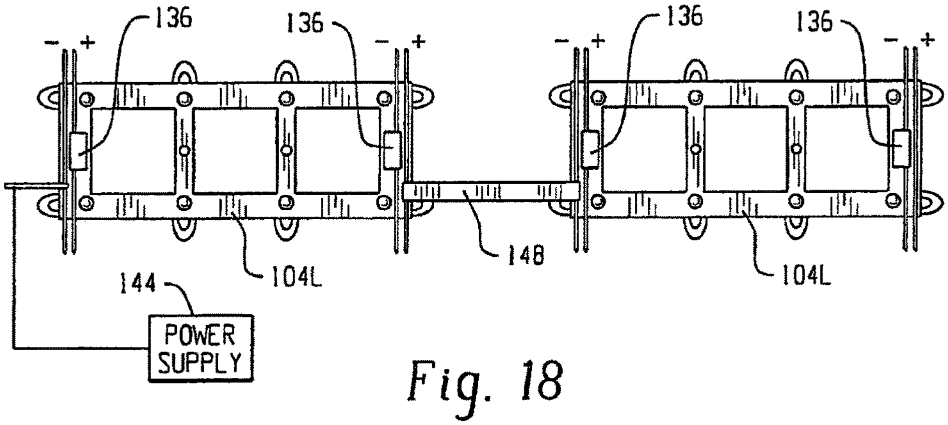
Figure 19:
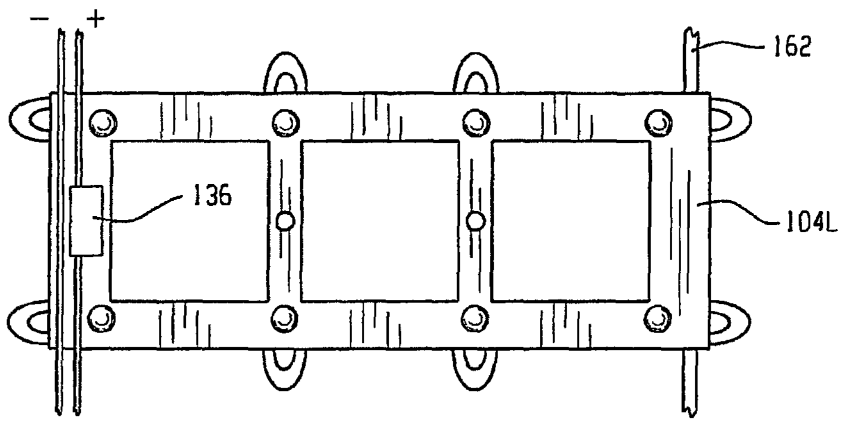

Illustrated in FIG. 17, one power supply 144 may be used to supply the power to one (1) or more columns of panels through the use of splice connectors 146. Alternatively, IDCs 136 and quick connect wires 148 may be used between the columns to deliver power from one column of panels 104L to the next panel 104L, as depicted in FIG. 18. As shown in FIGS. 16 and 17, current is carried on both sides of panel 104L. Alternatively, current may be carried on only one side of panel 104L and IDC 136 may be located on the side of panel 104L which carries the current for delivering power to another column of panels 104L. If desired a flexible strip 162 may be attached to the other side of panel 104L for support as shown in FIG. 19. Alternatively, the wire between adjacent panels may be soldered to each panel. For a particular system, combinations of IDCs and soldering may be used. In another embodiment, power may be supplied to both sides of panel 104L as shown in FIG. 15. Panel 104L in FIG. 15 may include one or more IDCs 136. A further optional feature is mounting points 138, if mounting of panel 104L is desired for the particular application.

In one certain embodiment, a single power supply may be used to supply power to a sufficient amount of columns or rows of panels 104 to illuminate up to about twenty (20) square feet ($ft^2$) of surface area of a sign face. It is further preferred that the power source is used to provide power to at least about fourteen (14) square feet ($ft^2$) of surface area of a sign face. The embodiments for a backlight system described herein are applicable to both of 12V and 24V systems. Also, system 100 may operate as a constant voltage applied to each board, constant current applied to each panel, or a constant voltage power source.

In one particular embodiment, LEDs 106 on panel 104L may be electrically connected together and mounted to panel 104L using a flex circuit or wires. The entire panel 104L may be fitted with an over mold 122. In one approach, use of the wires as part of the mechanical support for the system 100 can assist in layout when removing from packaging and when securing to a sign back plate. In addition, wires can provide trouble-free assembly, by providing a redundant electrical connection to power. For example, one of the two wires can be cut without severing electrical ties, thereby providing additional flexibility in panel placement or rotation for start of a new row. Modules can be structured to allow overlapping of panels to provide gaps in material for LEDs from bottom panel to shine through to the face of the cabinet sign.

Figure 20:
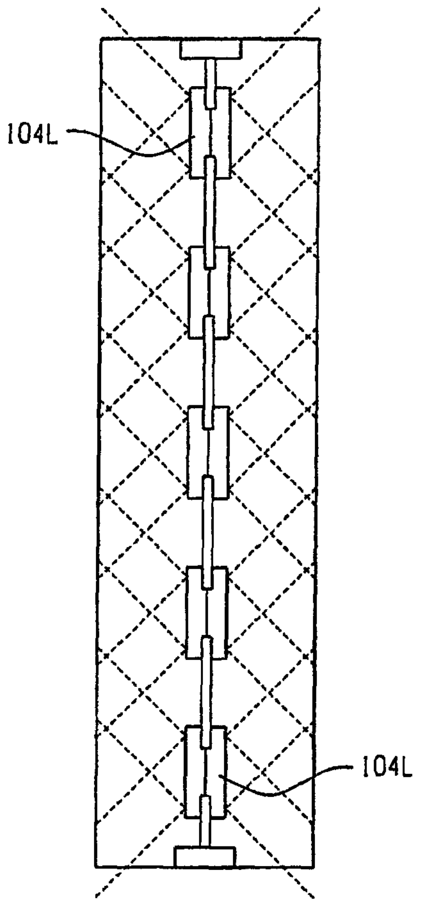
FIGS. 20 and 21 illustrate alternatives how the backlighting system disclosed herein may be used in double sided signs.
Figure 21:
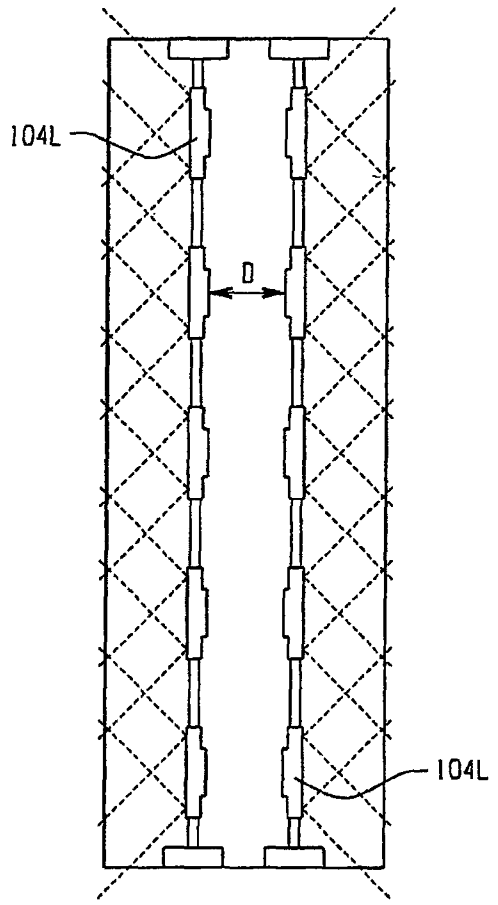

System 100 may be used in a double sided cabinet signs as depicted in FIG. 20 and FIG. 21. In FIG. 20, two (2) columns of panels 104L are mounted back to back. Snap-on connectors may be used to mount the opposing panels 104L back to back. Alternatively, as illustrated in FIG. 21, opposing panels 104L may be separated by a desired distance D.

Figure 22A:
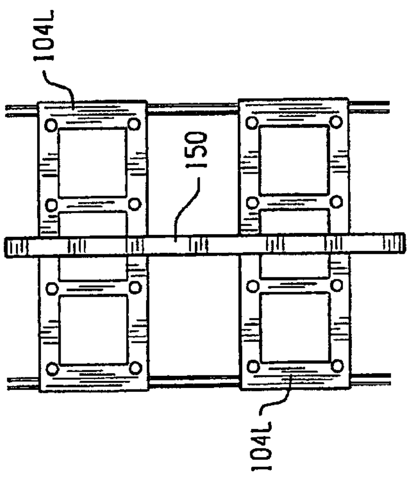
FIGS. 22A-F depict various brackets that may be used with the panels of the backlighting system.
Figure 22B:
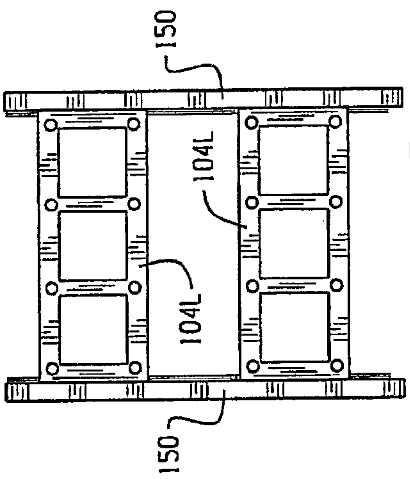
Figure 22C:
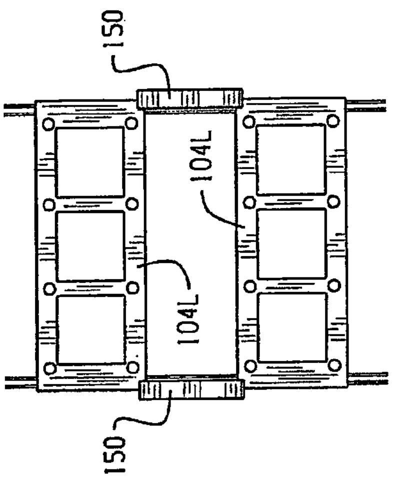
Figure 22D:
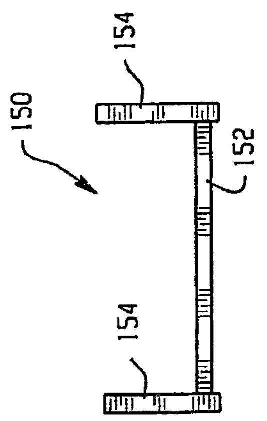
Figure 22E:
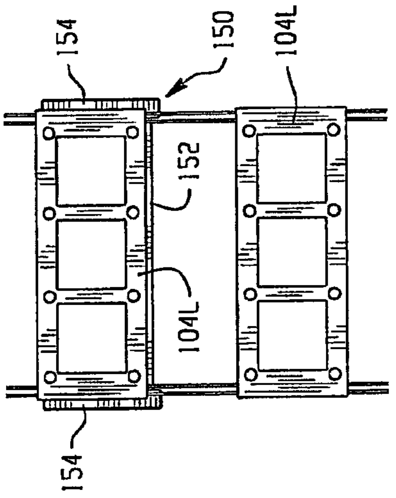
Figure 22F:
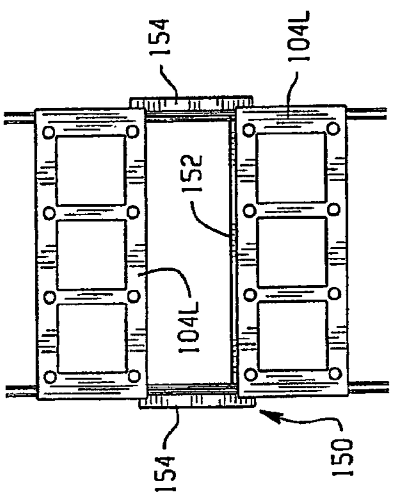

When mounting panel 104L to a back plate, if maintaining LEDs 106 on panel 104L perpendicular to the front surface of the cabinet sign is a concern, a guide 150 may be used to maintain the location of panels 104L. Variations of guide 150 are illustrated in FIGS. 22A-F. In FIG. 22A, guide 150 is depicted as a flat bar applied across all panels 104L in a column of panels. In a second embodiment, guide 150 may consist of two flat bars; one mounted to each end of panels 104L in a particular column of panels 104L. A third embodiment is shown in FIG. 22C. Guide 150 may consist of two flat bars which are applied to two adjacent panels 104L in a column of panels. In the final embodiment, depicted in FIGS. 22D-F, guide 150 may comprise a bracket. Preferably, the bracket includes a base 152 and two vertical arms 154. In the embodiment shown in FIG. 22E, panel 104L is mounted in a sliding track in each one of arms 154. As for FIG. 22F, two adjacent panels 104L may be connected together. A first panel is attached along a top section of each of arms 154 of guide 150 and a second panel 104L is attached along base 152 of guide 150.

Guides 150 may be made out of any suitable material for aligning panels 104L. In one embodiment, guides 150 are constructed from plastic. However, other materials of construction may be suitable also. Additionally, guides 150 may be secured to a back plate if desired.

In an alternate embodiment, panel 104L may be formed by connector in between vertically adjacent panels 104R. The connector may be an integral piece of one of either of the vertically adjacent panels 104R. Additionally, each panel may include one or more pass throughs to pass a wire from one vertically adjacent panel 104R to another vertically adjacent panel 104R. Also, the connector may be a unitary element or a multi-piece unit. Lastly, the connector may include a hinge such that between two adjacent panels 104R, a first panel may be moved located in a non-parallel manner to the second panel.

The system 100 as described above has a particular advantageous application as the lighting system of cabinet sign with a surface area of less than 200 square feet (ft). In another embodiment, the use of system 100 in the cabinet sign will maximize uniformity and not require the same depth between the sign and the light source as a cabinet sign which uses a fluorescent light source.

Furthermore, system 100 will decrease sign building costs by reducing installation time of the backlighting system into the cabinet. Also LEDs typically have a much longer life expectancy than fluorescent bulbs which will reduce maintenance costs. Additionally, system 100 is simple to install and it is flexible to accommodate different cabinet sign sizes. In addition to system 100 being adaptable to different sized cabinets, system 100 may be arranged various distances from the sign face of the cabinet sign. Also, system 100 is suitable for those types of cabinet signs having a backing plate for mounting system 100 and for those signs which do not include a backing plate. Accordingly, system 100 is suitable for single sided and double sided cabinet signs.

Also, panels 104 of system 100 may use series/ parallel architecture. Furthermore, adjacent columns of panels 104 may have the benefit of plug-n-play connections between the columns. The plug-n-play connections between the columns may comprise panels 104 including one or both of an insulation displacement connector or one or more butt splices.

As for the individual panels, in one embodiment, each panel may include two (2) separate series of LED chains. Alternatively, each panel may include at least two (2) separate drivers per panel for separate series LED chains, intermixed on the panel. This will have the benefit of the failure of one LED not being noticed on the face of the sign due to the LEDs from each chain being spatially intermixed so that one area of the face of the sign is not significantly impacted.

Figure 23:
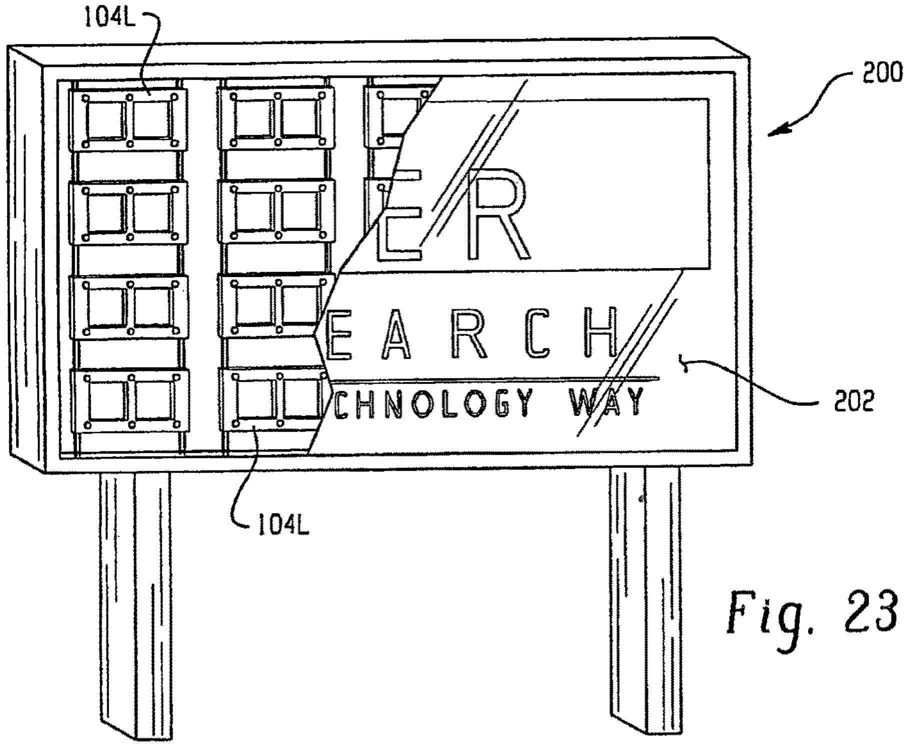
FIG. 23 is an embodiment of a cabinet sign which includes a backlighting system as disclosed herein.
Figure 24:
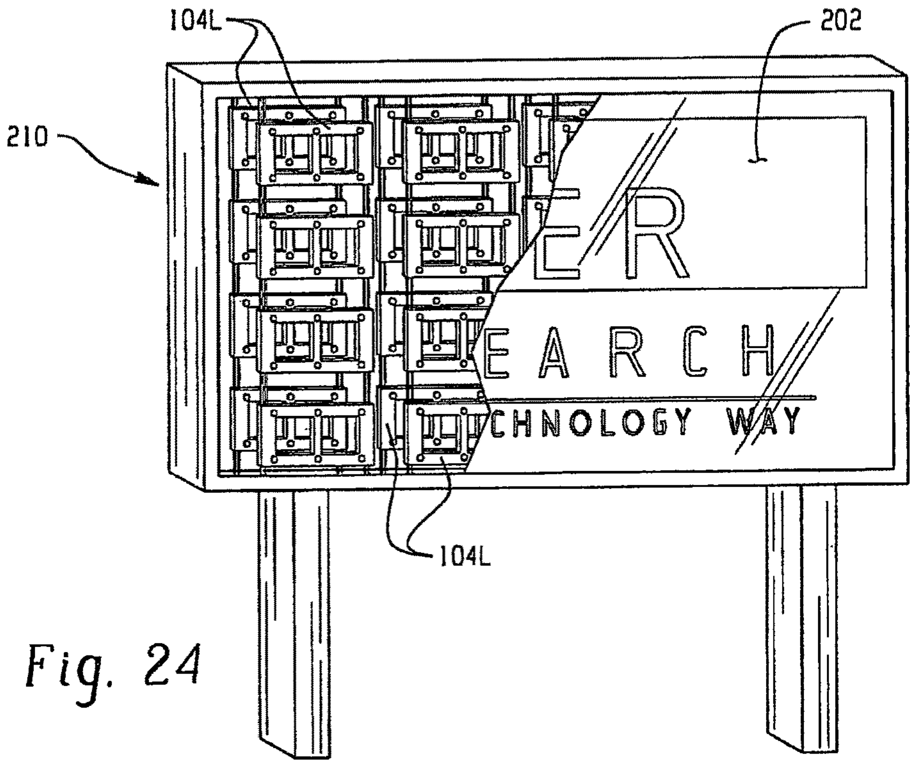
FIG. 24 is an embodiment of a cabinet sign which includes a double array backlighting system as described herein.

Depicted in FIGS. 23 and 24 are cabinet signs which include a partial view of the sign face so that the backlighting system for each sign is shown. In FIG. 23, sign 200 includes a single array of panels 104L to illuminate sign face 202. The panels 104L are arranged in vertical columns as shown in FIG. 12. FIG. 24 includes a double array backlighting system in which panels 104L are arranged as illustrated in FIG. 14. If so desired, a double array may be used if it is desired to increase the intensity of the light used to illuminate sign face 202.

Figure 25:
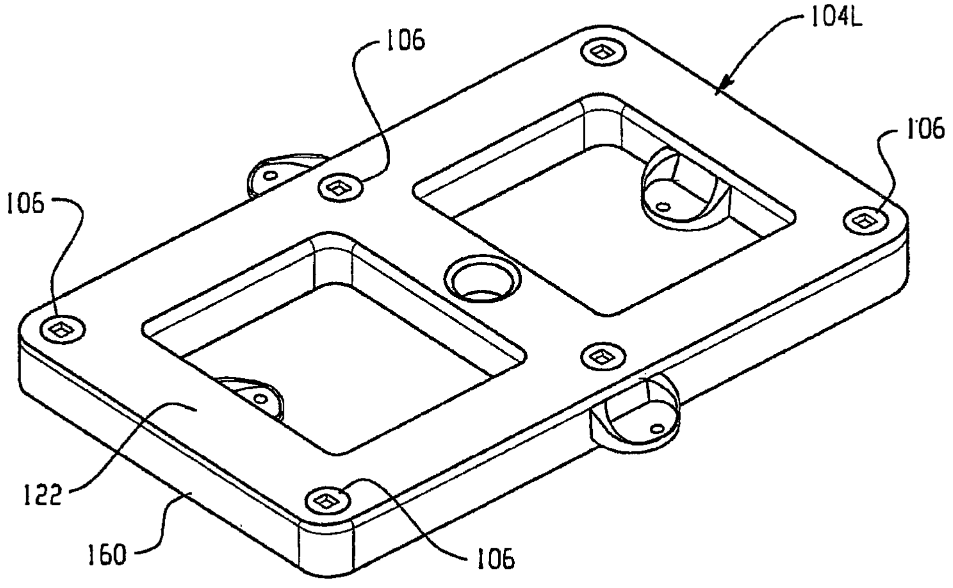
FIG. 25 is a rectangular panel which includes an over mold.

FIG. 25 is an illustration of a panel 104L which includes a plurality of LEDs 106 and an over mold 122. Panel 104L also includes a casing 160 around the exterior edges of panel 104L and over mold 122.

Backlighting system 100 may be substantially devoid of optics. System 100 optionally may not include any of the following items: (1) phosphor panel, (2) a brightness enhancing film, (3) a diffuser, and (4) a light pipe. Furthermore, system 100 may not include a fluorescent bulb and/or ballasts.

System 100 also offers a unique advantage with packaging and storage, in that system 100 may be foldable or rollable at an end user's options. This makes system 100 easy to package and transport to an end user and likewise, system 100 is convenient for the end user to store once it has been delivered.

Additionally, a particular embodiment of system 100 may have a cut resolution of no more than about 3, more preferably, no more than about 2, and even more preferably no more than about 1.

Figure 26A:
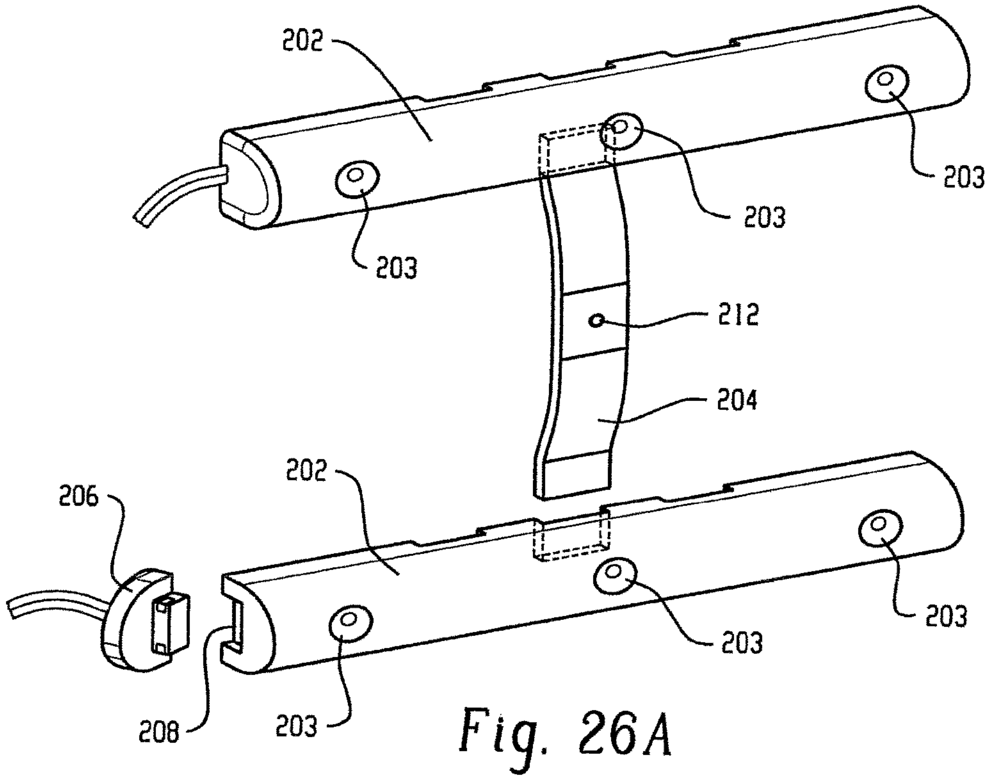
FIG. 26A illustrates a three LED module that is coupled to a bridge, in accordance with an exemplary embodiment.

FIG. 26A illustrates an alternative embodiment, wherein two modules 202 are coupled to a bridge 204 in order to provide flexible lighting systems that have particular desired size and light output. The bridge 204 can be constructed of substantially any suitable material such as a plastic or other similar material. Each module 202 can be coupled to the bridge 204 via a recessed portion that can accept a mechanical tab connecter or equivalent from the bridge. In one approach, the bridge can include electrical connectors in order to facilitate delivery of power and/or electrical control signals to the modules 202. In addition, the bridge can include a connector 212 to accommodate an additional module.

Each module 202 includes a plurality of LEDs 203. In one representative embodiment, three LEDs are included for with each module 202. The LEDs 203 can be spaced apart a predetermined distance such that a fixed number of LEDs 203 are based in part upon the length of the modules 202. Since each module is detachable from the bridge 204, the lighting system can easily be deconstructed and packaged for transport.

Power can be delivered to the LEDs 203 on the modules 202 utilizing an end cap power input plug 206. The end cap power input plug 206 can be a male component and coupled to the module via a female power input connector 208. The power input plug 206 includes electrical contacts that are coupled to the female connector 208 to deliver power when the power input plug 206 is plugged in. In this manner, once the modules 202 have been mounted in a particular location, power can be delivered via the connection between the power input plug 206 and the female connector 208.

Figure 26B:
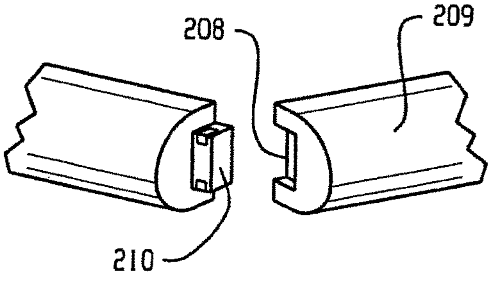
FIG. 26B illustrates a modular electrical connection of the lighting system, in accordance with an exemplary embodiment.

Similarly, modules 202 can be coupled to an additional module 209 via a modular power throughput port 210. FIG. 26B illustrates the connection between the module 202 and the module 209 via the modular power throughput port 210 and corresponding female power input connector 208 located on the module 209. In this embodiment, the modular power throughput port 210 is located on the opposite side of the module 202 as the external power input. It is to be appreciated, however, that the modular power throughput port 210 can be located in substantially any location on the module 202. The location of the modular power throughput port 210 can be related to a desired configuration of the modules 202 in relation to one another. Allowing flexible connectivity between modules by providing associated power connectors in convenient locations facilitates flexible design and manufacture of various desired illumination elements.

Figure 26C:
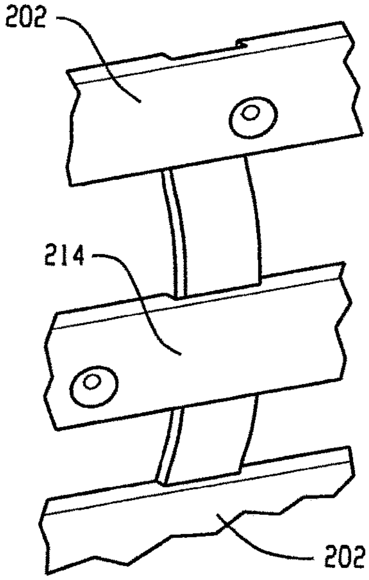
FIG. 26C illustrates a connecting element to allow a second light module to be attached to the lighting system, in accordance with an exemplary embodiment.
Figure 26D:
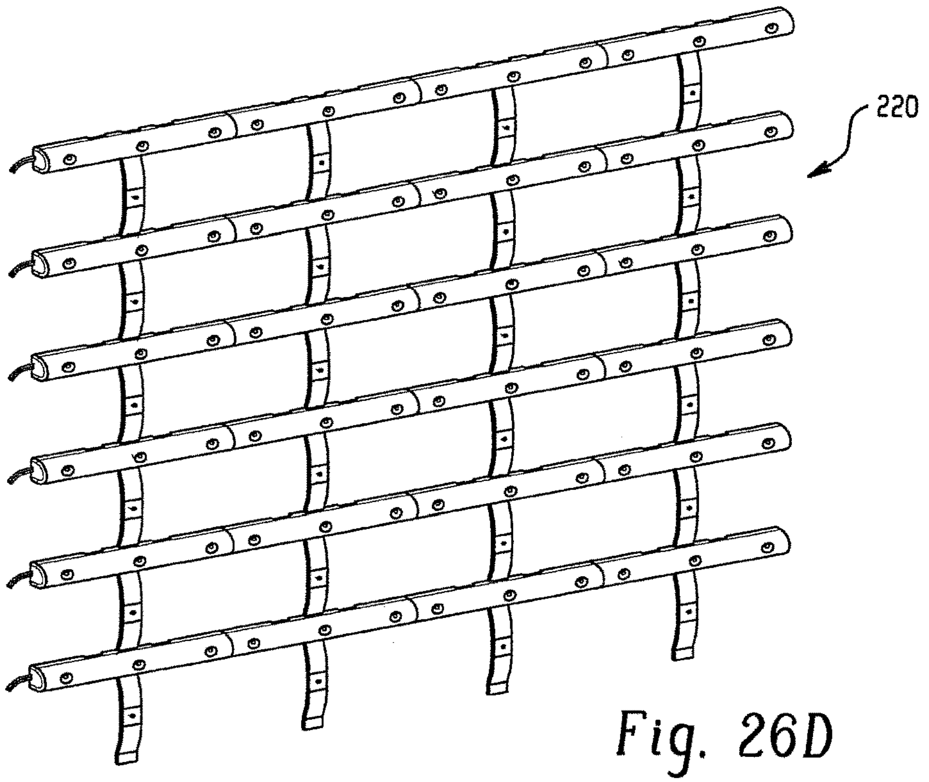
FIG. 26D illustrates a single array lighting system, in accordance with an exemplary embodiment.
Figure 26E:
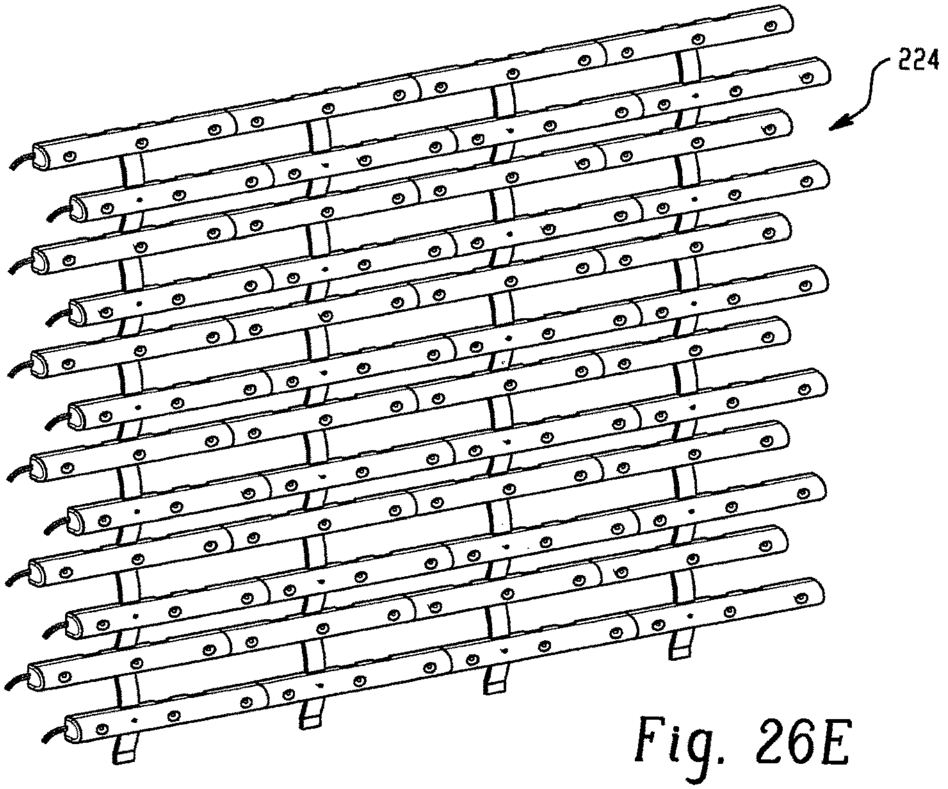
FIG. 26E illustrates a double array lighting system, in accordance with an exemplary embodiment.

FIG. 26C illustrates how a second array 214 can be coupled to the bridge 204 via the connector 212. In one embodiment, the FIG. 26D illustrates a single array illumination system 220 that is created utilizing a plurality of modules 202 and bridges 204 as shown in FIG. 26A. FIG. 26E illustrates a double array illumination system 224. In one approach, the illumination system 224 is created by coupling a plurality of second arrays 214 to a plurality of respective connectors 212.

Figure 27A:
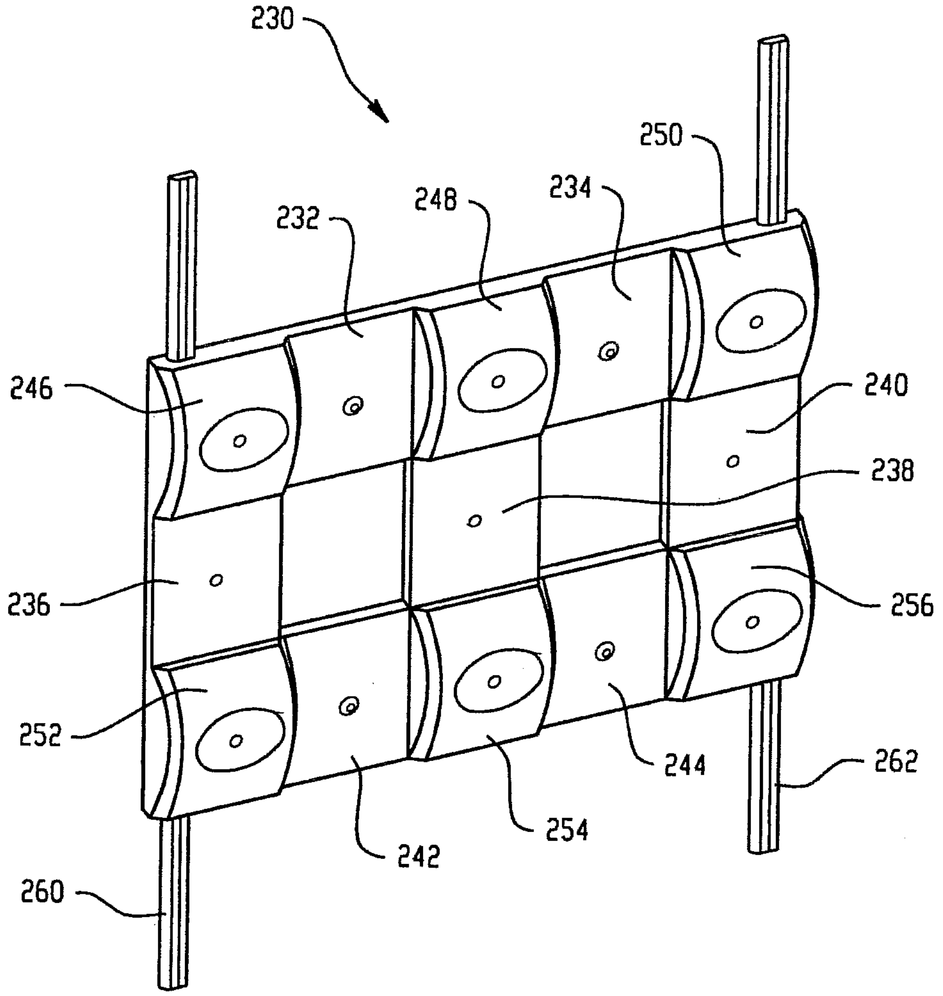
FIG. 27A illustrates a six LED module, in accordance with an exemplary embodiment.

FIG. 27A illustrates an interlocking LED panel 230 that facilitates a single or a double array of modules. The interlocking panel 230 includes a plurality of recesses 232, 234, 236, 238, 240, 242, and 244 that can accommodate a disparate interlocking module to provide additional light output for a system. Each recess 232-244 can include one or more connectors that protrude from the surface of each recess of the LED panel 230 and are seated in the back of an LED panel which is stacked on top. One LED is located on each raised form 246, 248, 250, 252, 254, and 256. Power is provided to the interlocking panel 230 via power lines 260 and 262 located on either side of the panel 230 as described above in FIG. 12. It is to be appreciated that the LEDs can be spaced apart substantially any distance from each other and that such spacing may not be uniform throughout the panel.

Figure 27B:
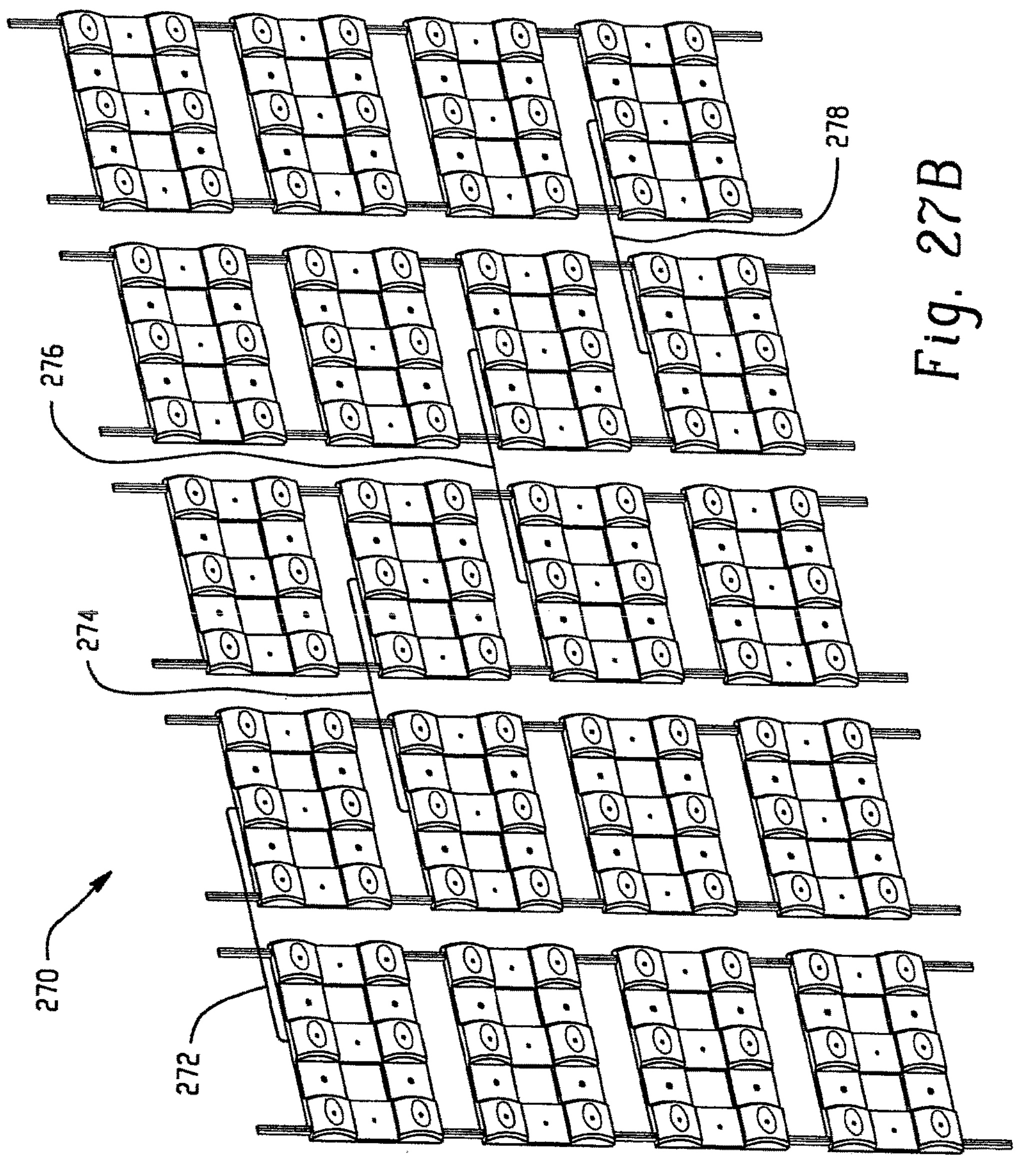
FIG. 27B illustrates a single array utilizing the six LED module, in accordance with an exemplary embodiment.

FIG. 27B shows a single array lighting system 270 that employs a plurality of interlocking LED panels 230. The lighting system 270 includes five columns wherein each column includes four interlocking panels 230. Power from each column is distributed via a power connector 272, 274, 276, and 278. In this manner, a plurality of panels can be connected in substantially any configuration.

Figure 27C:
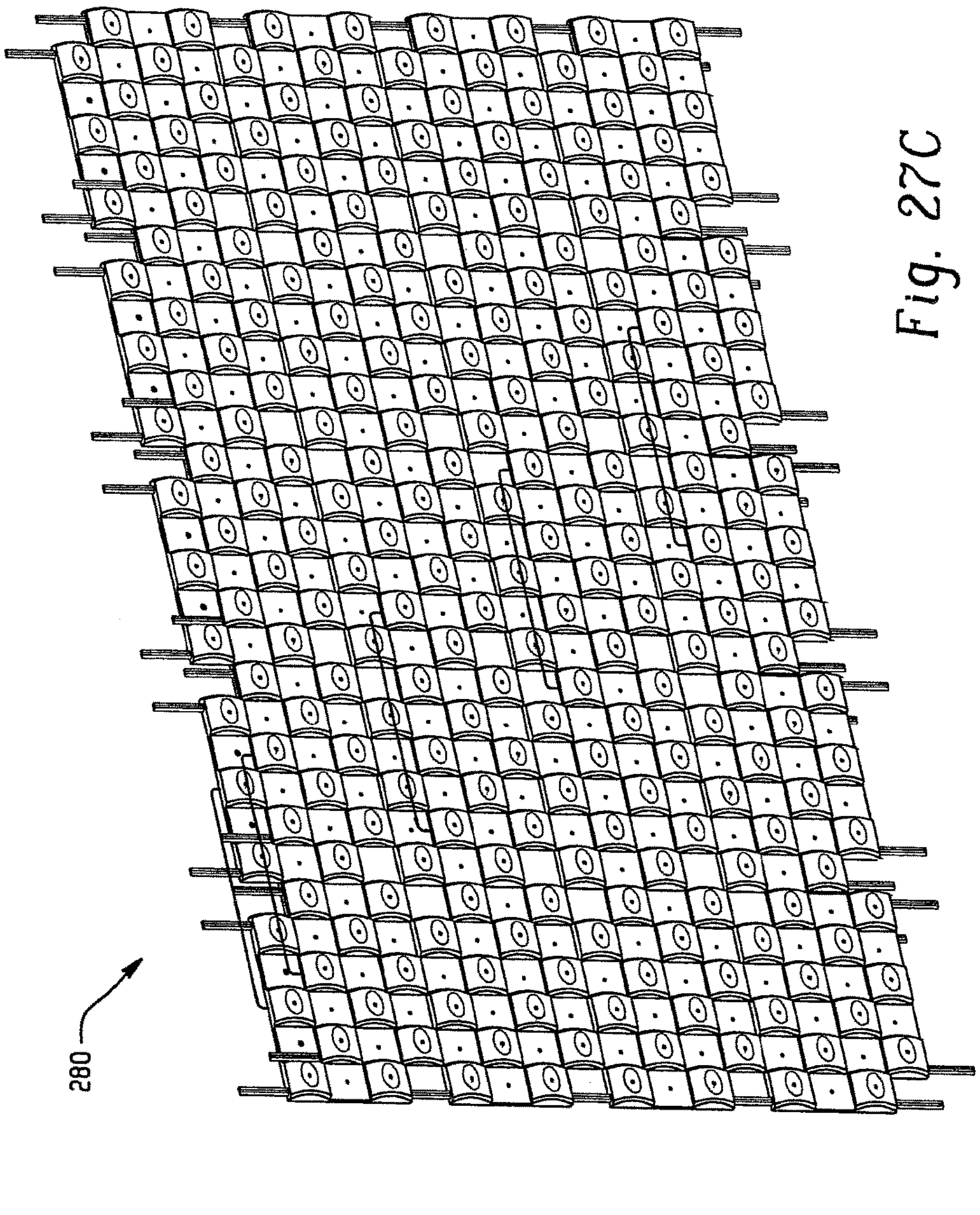
FIG. 27C illustrates a double array utilizing the six LED module, in accordance with an exemplary embodiment.

FIG. 27C illustrates a lighting system 280 that includes a double array of interlocking LED panels 230. A second set of LED panels is stacked on top of the first set such that the back of the top LED panels is coupled to the bottom set of LED panels via connectors located on the surface of each recess 232-244. The double array system 280 is very similar to the single array system 270 in terms of connectivity. However, the system 280 also includes a second set of LED panels 230 that are placed in the recesses 232-244 of the single array system 270. Power for the second set of LED panels can be provided via two power lines 260 and 262. In one approach, power is provided via the connectors from the bottom set of LED panels to the top set of LED panels so that the top set of panels does not require power lines to be connected therewith.

Figure 28A:
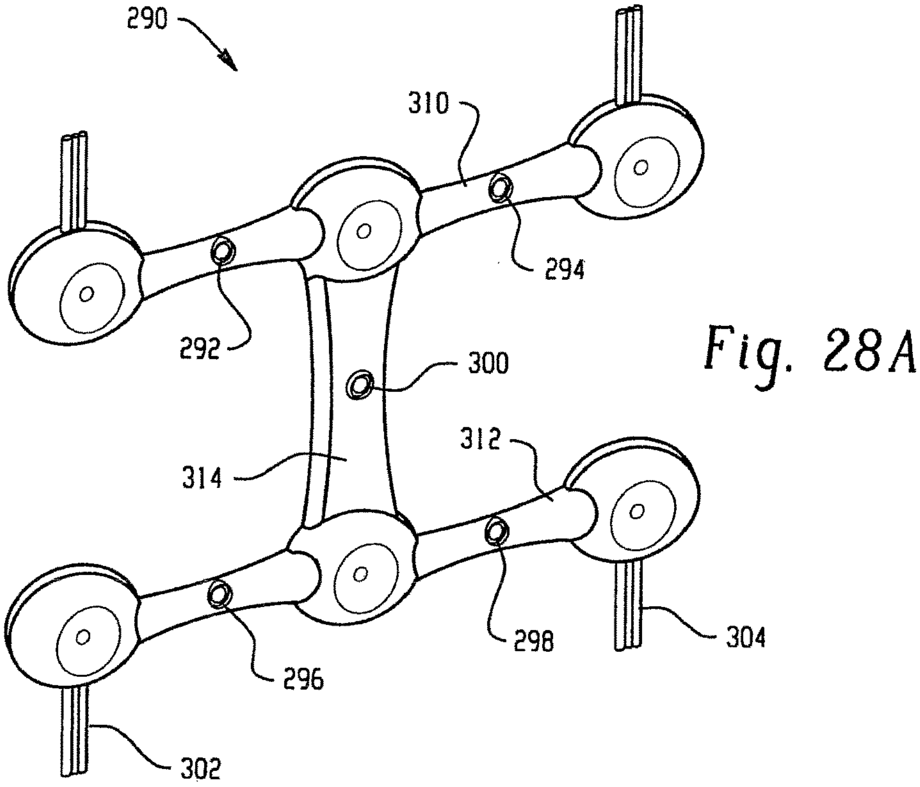
FIG. 28A illustrates an alternate six LED module lighting system, in accordance with an exemplary embodiment.

FIG. 28A illustrates an I-shaped LED panel 290 that includes a first arm 310 and a second arm 312 positioned in parallel to one another and connected by a cross member 314. The first arm 310 includes three LEDs and two connectors 292 and 294. The second arm 312 includes three LEDs and two connectors 292 and 294. The first arm 310 and the second arm 312 are connected via the bridge 314 which includes a connector 300. The connectors can be employed to allow stacking of the I-shaped LED panels 290 to provide a double array of LED panels for a desired lighting system configuration. In one approach the connectors are a protrusion from the surface of the I-shaped LED panel which is seated in corresponding dimples in the back of LED panels stacked on top thereof.

Figure 28B:
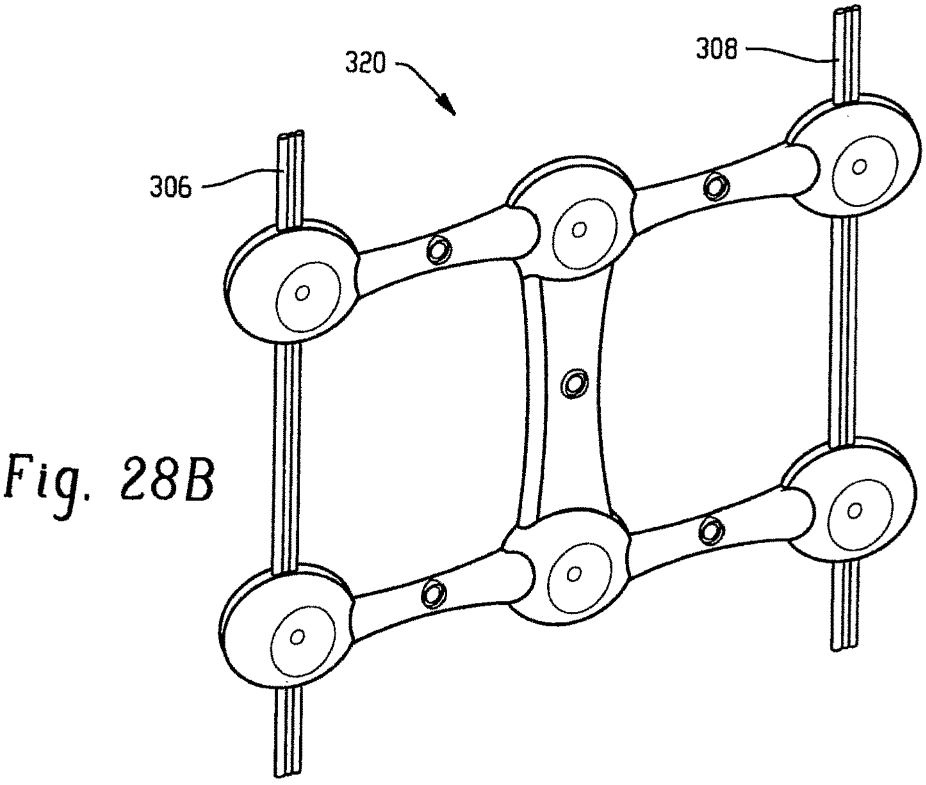
FIG. 28B illustrates an optional wire pass through embodiment of the six LED module lighting system, in accordance with an exemplary embodiment.

Power is delivered to the I-shaped LED panel 290 via power lines 302 and 304. FIG. 28B shows an alternated embodiment wherein power is delivered to the I-shaped LED panel 290 via power lines 306 and 308. In this embodiment, the first arm 310 and the second arm 312 are connected via the power lines 306 and 308 respectively. In a disparate embodiment, power can be delivered to top LED panels in a double array configuration via the connectors 292-300.

Figure 28C:
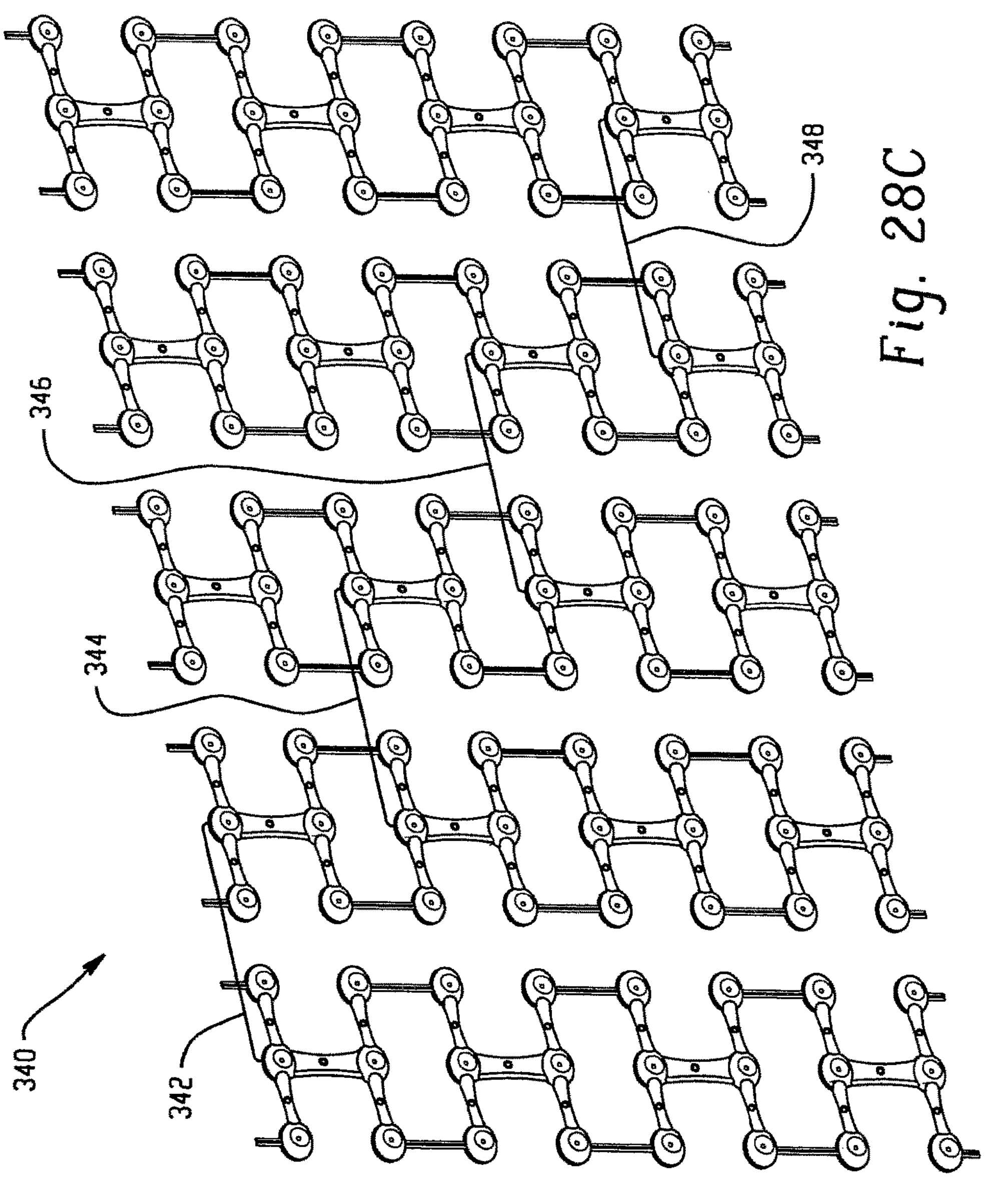
FIG. 28C illustrates a single array utilizing the alternate six LED module, in accordance with an exemplary embodiment.
Figure 28D:
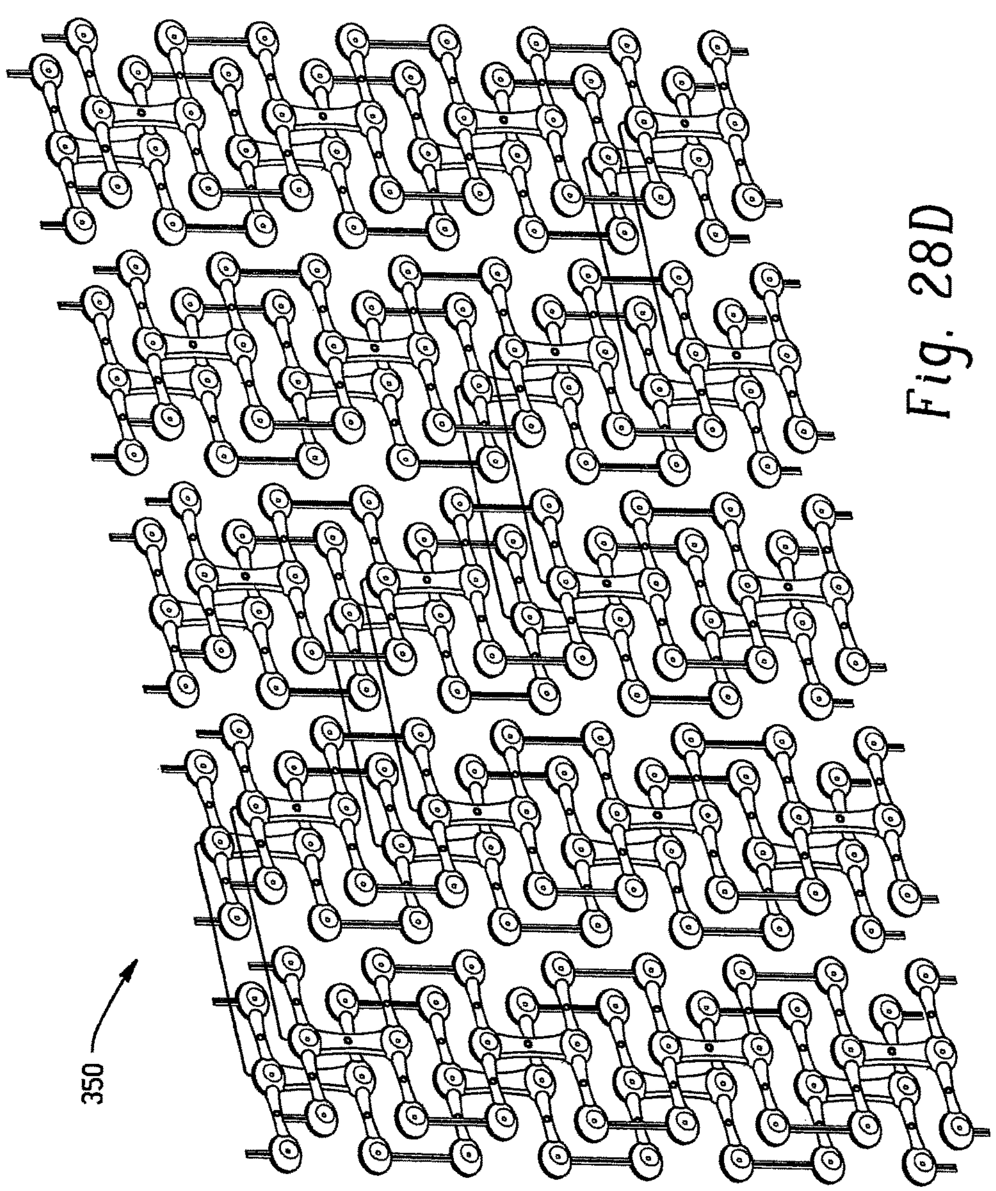
FIG. 28D illustrates a double array utilizing the alternate six LED module, in accordance with an exemplary embodiment.

FIG. 28C illustrates a single array lighting system 340 that includes a plurality of I-shaped LED panels 290. The single array lighting system 340 includes five columns of I-shaped LED panels wherein each column includes four I-shaped LED panels. It is to be appreciated that substantially any number of LED panels can be configured in substantially any manner. Each column of I-shaped LED panels is connected via coupling lines 342, 344, 346, and 348. The coupling lines 342-348 can be employed to provide power and/or control signals from one group of I-shaped LED panels to another. FIG. 28D illustrates a double array lighting system 350 that includes the single array of lighting system 340 with an additional array of I-shaped light elements stacked on top therewith. As discussed above, the second top array can be coupled to the bottom array via connectors 292-300.

Figure 29A:
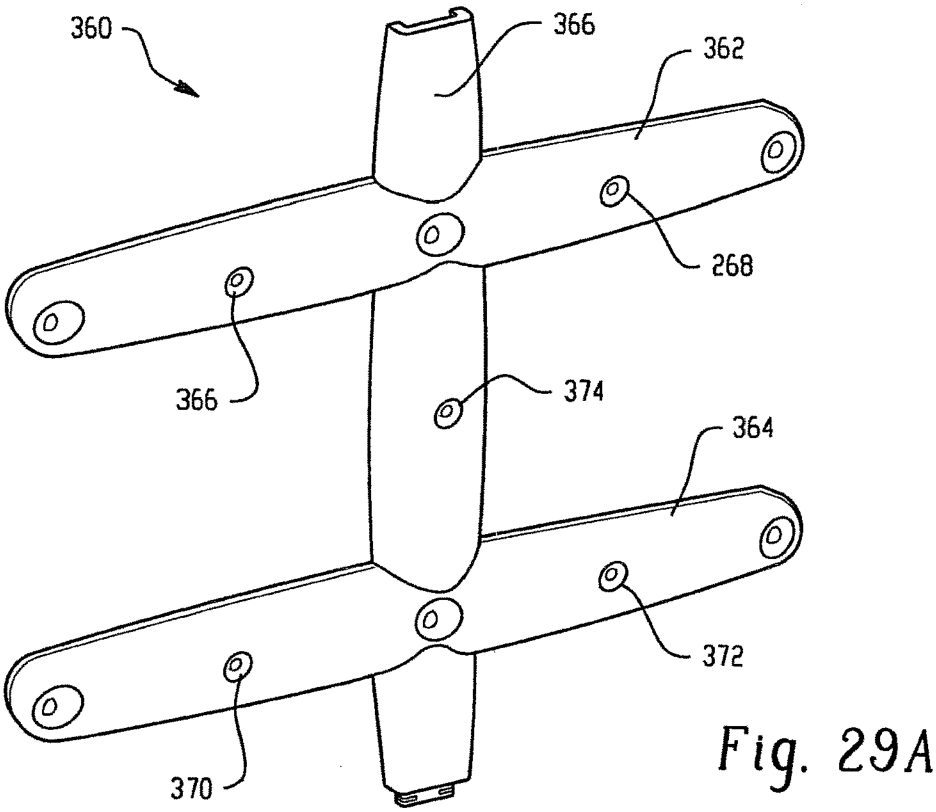
FIG. 29A illustrates an alternate six LED module lighting system, in accordance with an exemplary embodiment.

FIG. 29A illustrates an H-shaped LED panel 360. The LED panel 360 includes a first arm 362, a second arm 364 and a third arm 366. The first arm 362 and the second arm 364 are parallel to one another and are connected via the third arm 366 which is oriented perpendicular to the first and second arms 362 and 364. The first arm includes three LEDs and connectors 366 and 368. The second arm includes three LEDs and connectors 370 and 372. The third arm 366 includes a connecter 374 that is located between the first arm 362 and the second arm 364.

Figure 29B:
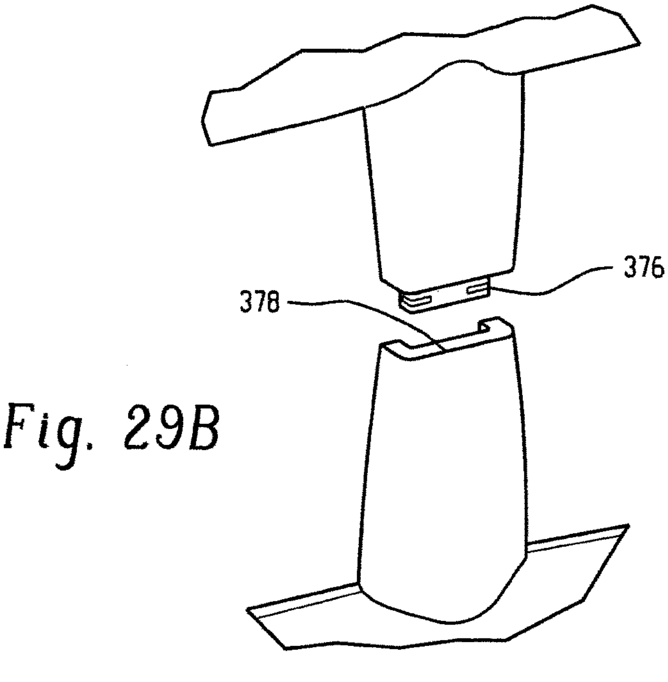
FIG. 29B illustrates electrical connectivity of the six LED module in FIG. 29A, in accordance with an exemplary embodiment.

The third arm 366 can include one or more power lines that are located within the body of the arm. The bottom of the third arm 366 can include a male power connector 376. The top of the third arm 366 can include a female power receptacle 378. In this manner, the H-shaped LED panel can be coupled to one or more disparate H-shaped LED panels via the male and female power connectors wherein power is delivered to all the LED panels. Such power delivery is illustrated in FIG. 29B. It is to be appreciated that although power delivered via the third arm 366, substantially any signal can be communicated. One example can be a control signal utilizing a particular communication protocol.

Figure 29C:
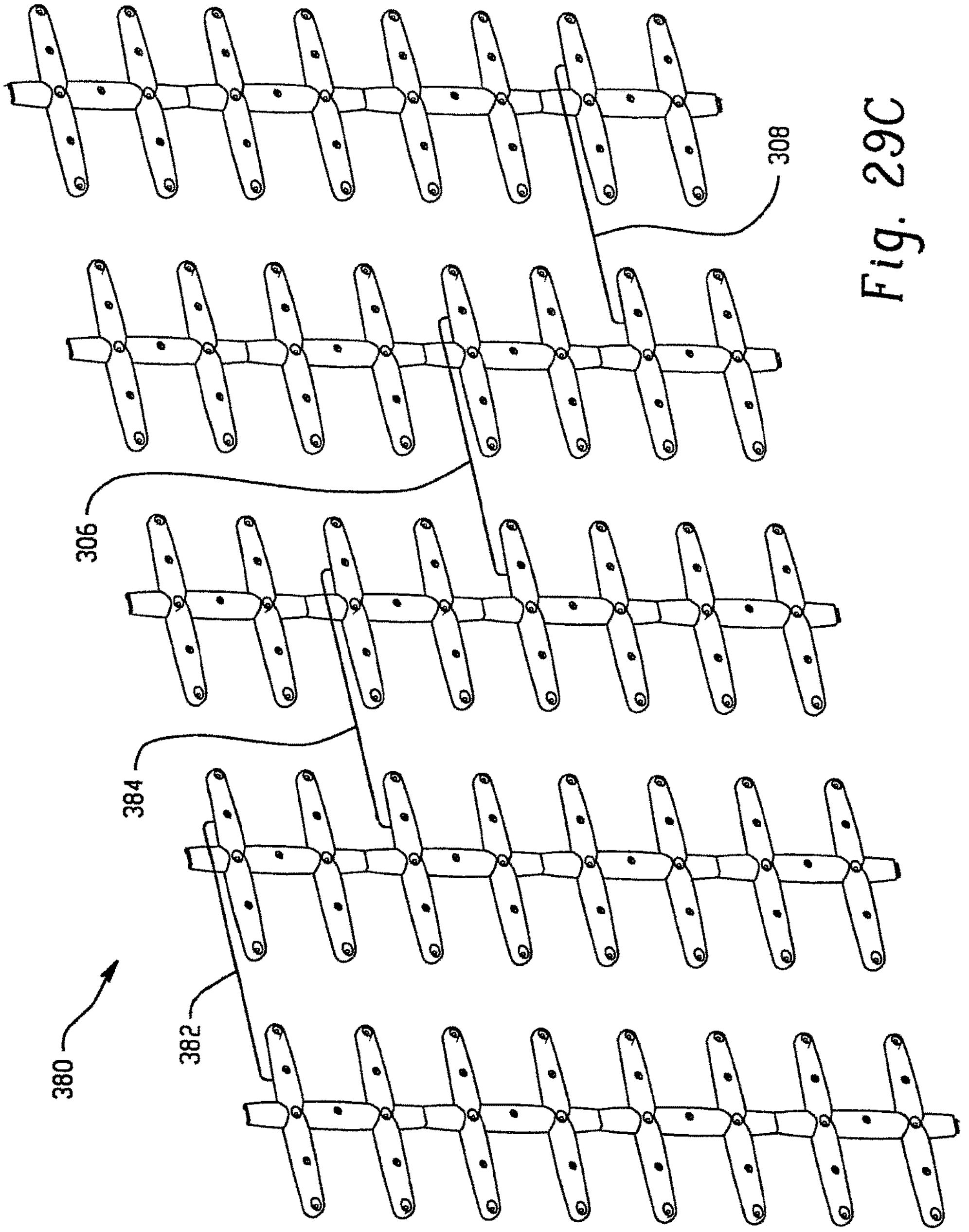
FIG. 29C illustrates a single array utilizing the six LED module in FIG. 29A, in accordance with an exemplary embodiment.
Figure 29D:
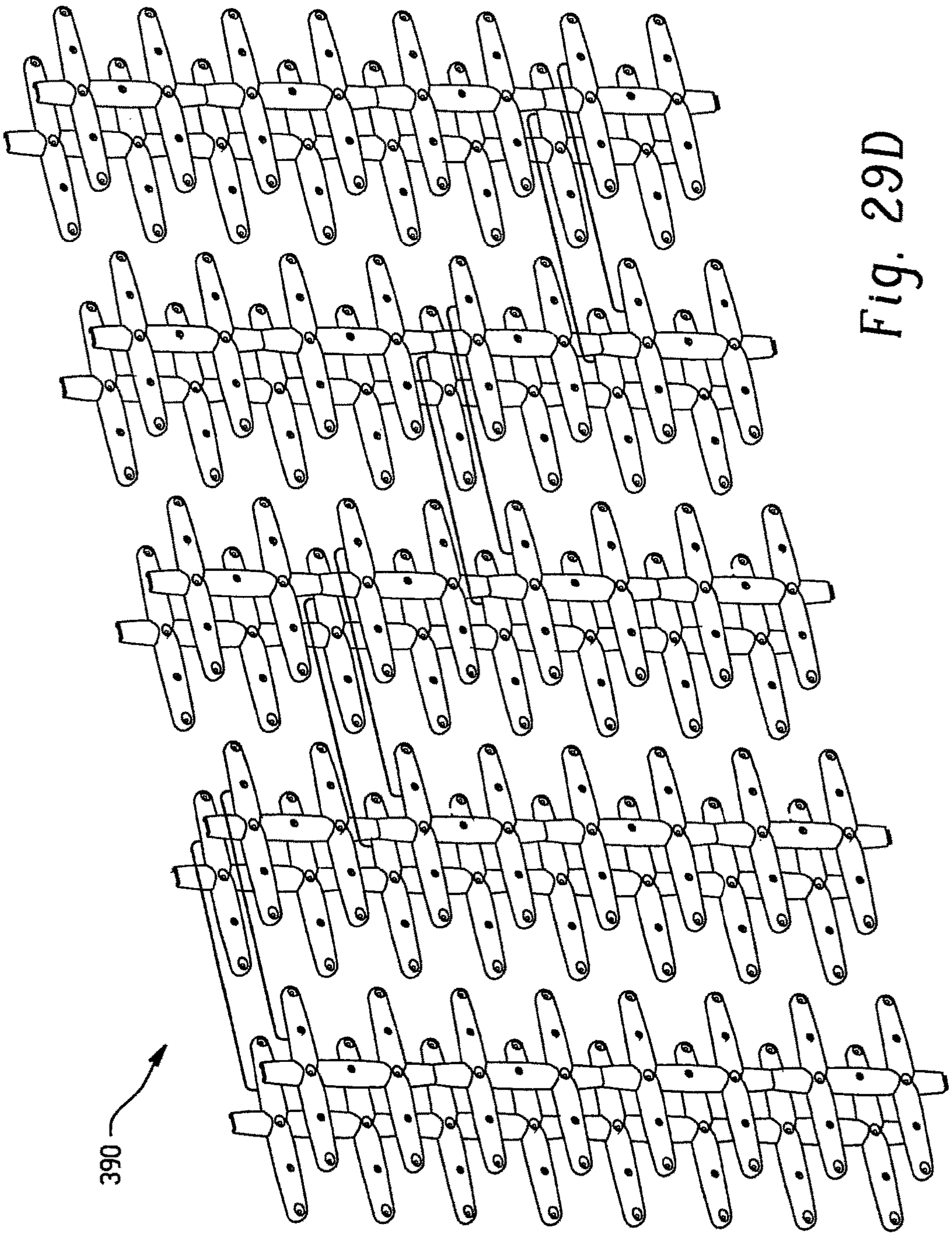
FIG. 29D illustrates a double array utilizing the six LED module in FIG. 29A, in accordance with an exemplary embodiment.

FIG. 29C illustrates a single array lighting system 380 that includes a plurality of H-shaped LED panels 360. The single array lighting system 380 includes five columns of H-shaped LED panels wherein each column includes four H-shaped LED panels. It is to be appreciated that substantially any number of LED panels can be configured in substantially any manner. Each column of H-shaped LED panels is connected via coupling lines 382, 384, 386, and 388. The coupling lines 382-388 can be employed to provide power and/or control signals from one group of H-shaped LED panels to another. FIG. 29D illustrates a double array lighting system 390 that includes the single array of lighting system 380 with an additional array of H-shaped light elements stacked on top therewith. The second top array can be coupled to the bottom array via connectors 366-374. The lighting systems 380 and 390 can be broken down into single LED panels to facilitate compact transport from one location to another.

Figure 30A:
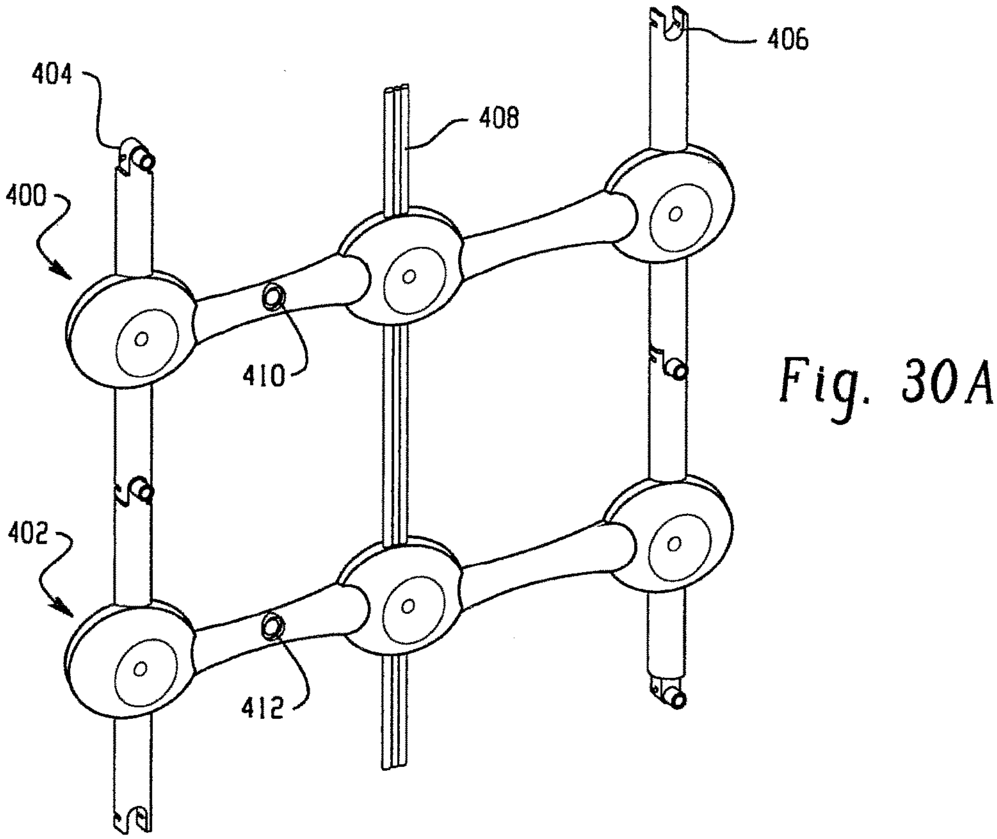
FIG. 30A illustrates a three LED module with a snap together hinge, in accordance with an exemplary embodiment.
Figure 30B:
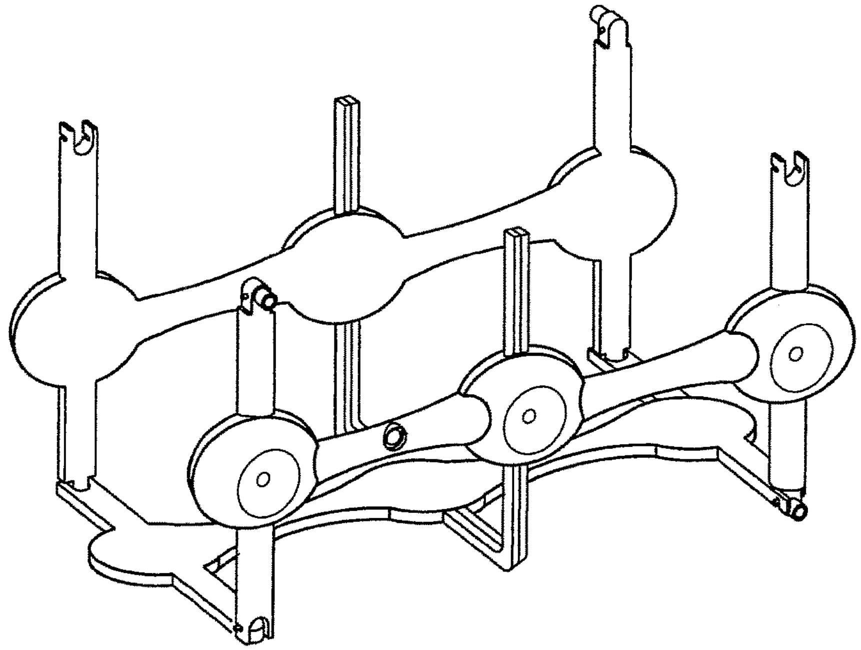
FIG. 30B illustrates an embodiment of the three LED module for shipping, in accordance with an exemplary embodiment.

FIG. 30A illustrates two modules 400 and 402 which each include three LEDs. Each module is comprised of three pods (one for each LED) on a single axis wherein an arm connects each pod to the one adjacent. Module 400 includes a male hinge component 404 on a first side of the module and a female hinge component 406 on a second side. The middle pod accommodates a power line 408. Module 400 is coupled to module 402 via the male and female hinge components 404 and 406 of module 400 to the corresponding female and male hinge components of module 402. Connectors 410 and 412 are employed to facilitate a double array lighting system wherein a second set of LED modules is stacked on top of a first set and coupled mechanically thereto. FIG. 30B illustrates folding two a plurality of modules together to provide a more compact footprint for transport. Such folding is facilitated via the hinges to couple two or more modules together.

Figure 30C:
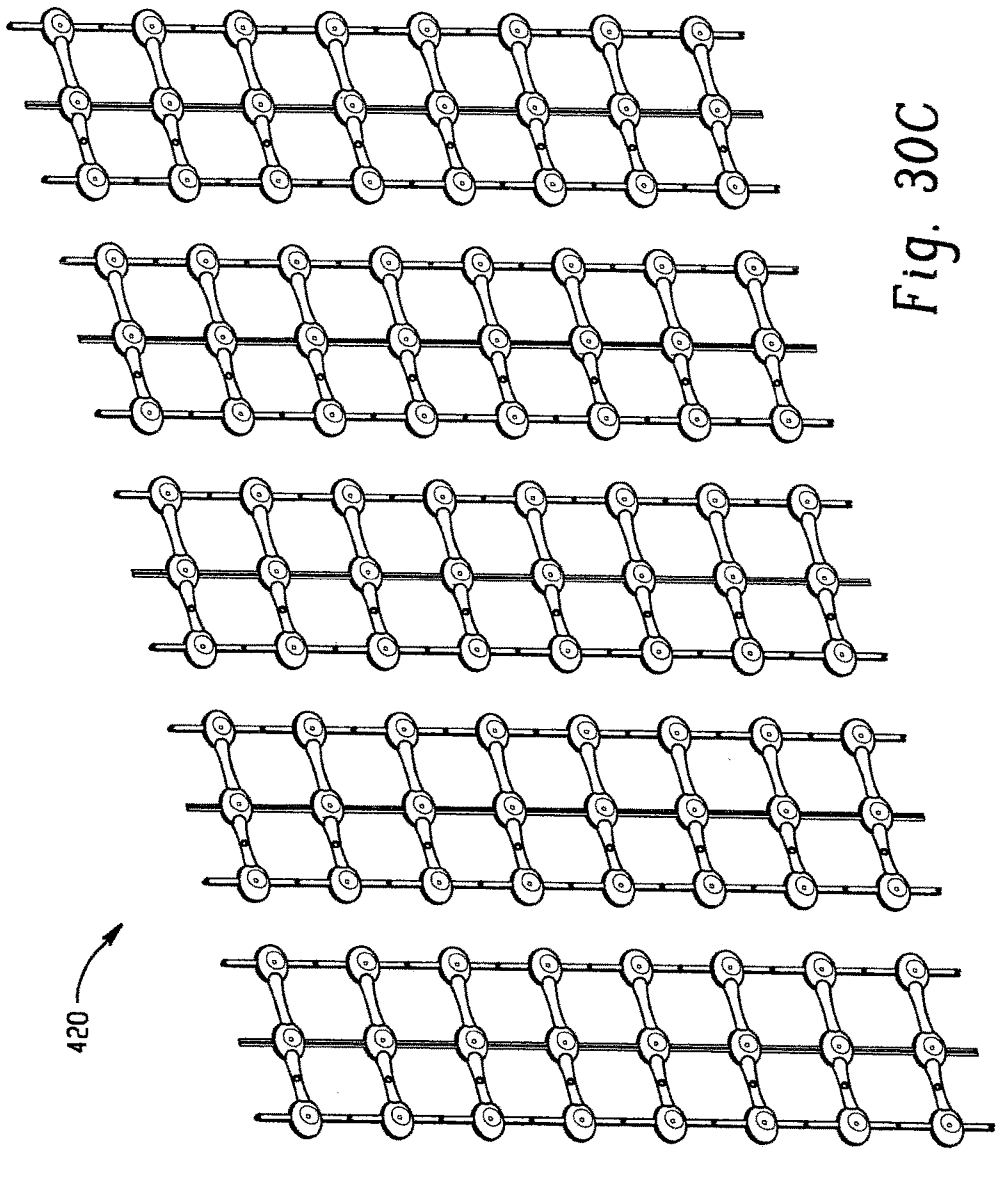
FIG. 30C illustrates a single array utilizing the three LED module, in accordance with an exemplary embodiment.
Figure 30D:
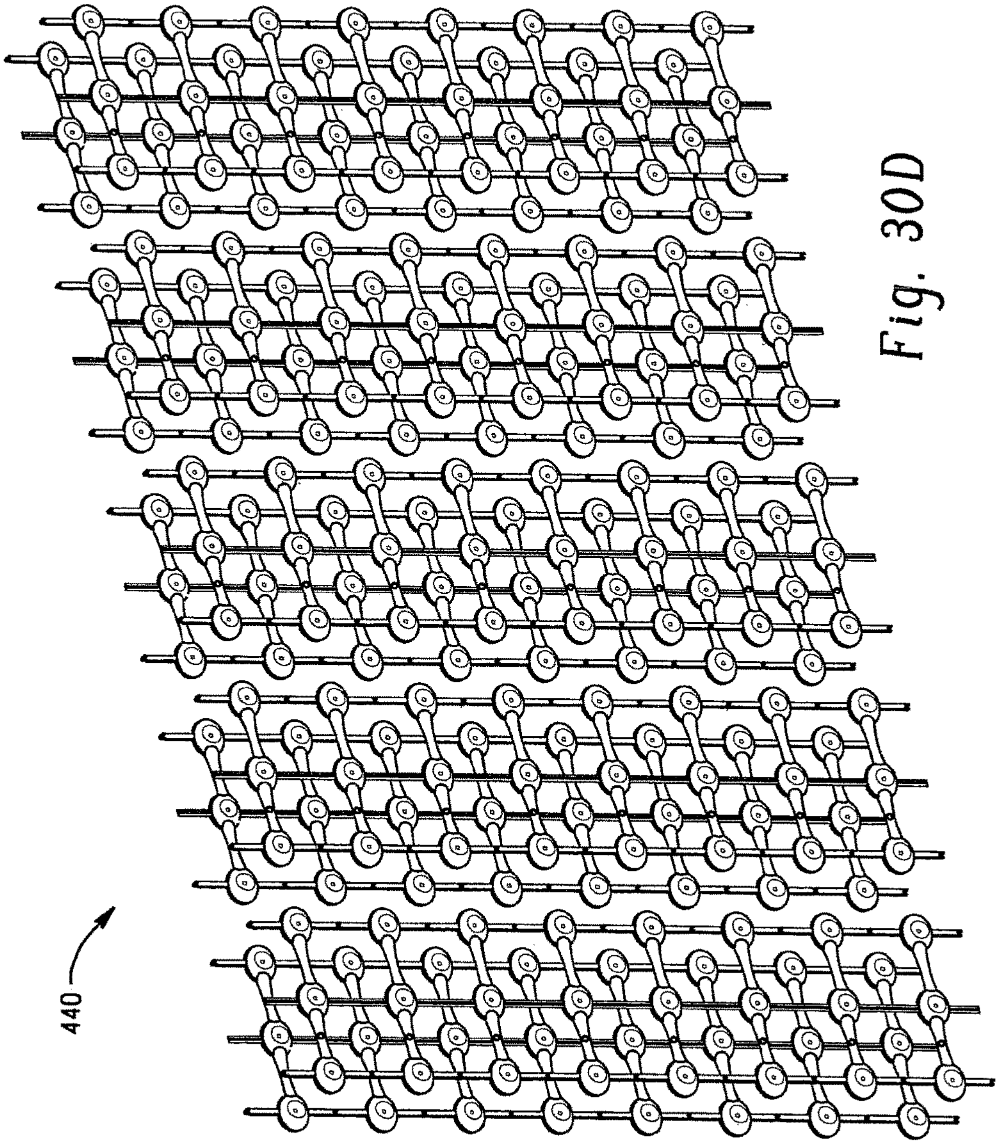
FIG. 30D illustrates a double array utilizing the three LED module, in accordance with an exemplary embodiment.

FIG. 30C illustrates a single array lighting system 420 that includes a plurality of LED modules 400. The single array lighting system 420 includes five columns of LED modules wherein each column includes four LED modules. It is to be appreciated that substantially any number of LED modules can be configured in substantially any manner. FIG. 30D illustrates a double array lighting system 440 that includes the single array of lighting system 420 with an additional array of LED modules stacked on top therewith. The second top array can be coupled to the bottom array via connectors 410 and 412. The lighting systems 420 and 440 can be broken down into single LED modules to facilitate compact transport from one location to another.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A lighting system for illuminating a sign, the system comprising: a plurality of electrically interconnected modules each module including a support comprised of an elongated printed circuit board having a major surface, circuitry on the support, and a plurality of light emitting diodes ("LEDs") in a linear array on the major surface electrically connected to the circuitry; one or more electrical conductors electrically connecting the plurality of modules; and one or more flexible strips independent of the one or more electrical conductors, said strips mechanically connecting adjacent modules; further comprising a clamping element receiving the one or more flexible strips for securing the lighting system to the frame of a sign.

2. The system of claim 1, wherein the one or more electrical conductors and the one or more flexible strips have sufficient flexibility that one module can be folded over its adjacent module.

3. The system of claim 1, wherein the one or more flexible strips comprise a ribbon.

4. The system of claim 1, further comprising an overmolding covering at least a portion of the front surface of the support.

5. The system of claim 1, wherein each module comprises a plurality of LEDs arranged in a one dimensional array.

6. The system of claim 1, wherein each module comprises a plurality of LEDs arranged in a two dimensional array.

7. The system of claim 1 wherein the LEDs are equally spaced apart.

8. The system of claim 1, further comprising three or more modules and wherein the one or more flexible strips mechanically connect adjacent modules to be equidistant from one another.

9. The system of claim 1, wherein the plurality of electrically interconnected modules form a lattice.

10. The system of claim 1 further comprising a clamping element receiving the one or more flexible strips for securing the lighting system to the frame of a sign.

11. The system of claim 1, wherein the support comprises a double-sided printed circuit board ("PCB").

12. A sign comprising a frame and the lighting system of claim 1 attached to the frame.

13. The sign of claim 12 wherein the plurality of modules are arranged in a row.

14. The sign of claim 12 wherein the plurality of modules are arranged in a column.

15. The system of claim 1 wherein said flexible strip is elongated and wherein a direction of elongation of said flexible strip is perpendicular to a direction of elongation of said printed circuit board.

16. A method of installation of a lighting system for illuminating a sign, the method comprising: providing a sign box including at least four side walls and opposed front and back walls, at least one of said front and back wall being light transmissive; forming a string of LED modules by mechanically connecting modules via one or more flexible strips, and securing at least two strips with-saidbetween opposed side walls of the sign; electrically connecting a plurality of electrical interconnected modules via one or more electrical conductors, the plurality of electrical interconnected modules each including a support, circuitry electrically connected to the circuitry; wherein said strips are disposed vertically and said LED modules on the support, at least one light emitting diode ("LED") are suspended away from the walls of the sign box.

17. The method of claim 16 further including:
securing the lighting system to the frame of a sign via a clamping element.

18. The method of claim 16, further including:
arranging the plurality of electrical interconnected modules in a one dimensional array.

19. The method of claim 16, further including:
arranging the plurality of electrical interconnected modules in a two dimensional array.

20. The method of claim 16 wherein said strips are disposed vertically and said LED modules are suspended away from the walls of the sign box.

21. A blacklighting system comprising:
a) a first plurality of light emitting modules, each module including:
a support,
circuitry on the support,
a plurality of light emitting diodes electrically connected to the circuitry and arranged in each module in a spaced relationship in a first array,
an overmolding covering the support;
b) wherein the first plurality of light emitting modules are arranged in spaced relationship to one another in a second array such that the relative spacing of the light emitting diodes between adjacent modules is substantially the same as the relative spacing of the light emitting diodes in a given module;

c) one or more insulated electrical conductors electrically connecting the first plurality of modules, said conductors being partially encompassed in the overmolding; and d) one or more flexible strips mechanically connecting adjacent modules in the second array.

22. The backlighting system of claim 21 wherein the one or more flexible strips define the relative spacing between adjacent modules.

23. The backlighting system of claim 21 comprising:

a) a second plurality of light emitting modules, each module including:
  a support,
  circuitry on the support,
  a plurality of light emitting diodes electrically connected to the circuitry and arranged in each module in a spaced relationship in a third array,
  an overmolding covering the support;

b) wherein the second plurality of light emitting modules are arranged in a spaced relationship to one another in a fourth array such that the relative spacing of the light emitting diodes between adjacent modules is substantially the same as the relative spacing of the light emitting diodes in a given module;

c) one or more insulated electrical conductors electrically connecting the second plurality of modules; and d) one or more flexible strips mechanically connecting adjacent modules in the fourth array.

24. The backlighting system of claim 23 wherein the fourth array is arranged in spaced relationship to the second array such that the relative spacing of the light emitting diodes between adjacent modules from the first plurality and second plurality is substantially the same as the relative spacing of the light emitting diodes in a given module.

25. The backlighting system of claim 23 wherein the second array and the fourth array are arranged relative to one another in a common plane.

26. The backlighting system of claim 23 wherein the first plurality of light emitting modules is electrically connected to the second plurality of light emitting modules, and further comprising a power supply to electrically energize the first and second plurality of light emitting modules.

27. The backlighting system of claim 23 wherein the light emitting diodes are arranged in a module in a linear array.

28. The backlighting system of claim 21 wherein the light emitting diodes are arranged in a module in a two-dimensional array.

29. The backlighting system of claim 24 wherein the first plurality and second plurality of modules are arranged adjacent one another in one of a series of columns and rows.

30. The system of claim 21 wherein adjacent modules are electrically connected by wires, the wire having sufficient flexibility that the adjacent modules of the plurality of modules are capable of being folded over on top of one another.

31. The backlighting system of claim 23 wherein the second plurality of modules is arranged relative to the first plurality of modules such that the light emitting diodes of the second plurality of modules are arranged intermediate the light emitting diodes of the first plurality of modules.

32. The backlighting system of claim 23 wherein the second plurality of modules is arranged relative to the first plurality of modules such that the light emitting diodes of the second plurality of modules are arranged to direct light in a direction opposite of the light emitting diodes of the first plurality of modules.

33. A cabinet sign comprising the backlighting system of claim 23.

34. The cabinet sign of claim 33 wherein the light emitting diodes have a box sign depth factor of about 1.4 or less.

35. A module for use in backlighting a cabinet sign, comprising:
  a printed wiring board having a direction of elongation;
  a plurality of LEDs mounted onto a first surface of the wiring board in a linear array, wherein the LEDs are equally spaced apart;
  an overmold surrounding the printed wiring board; and
  one or more interconnectivity components that facilitate an electrical connection between the module and one or more disparate modules; wherein the overmold further encompasses at least a portion of the interconnectivity components.

36. The module of claim 35, wherein the interconnectivity element is one of a male connector and a female connector connected to a module through a wire.

37. The module of claim 34 wherein said wiring board includes a second surface opposite the first surface, said second surface including a plurality of LED's.

38. A backlighting system for use in a cabinet sign, comprising:
  a plurality of interconnected modules configured in a first array, each module comprised of an elongated printed circuit board having front and back major surfaces, each module electrically coupled to at least one other module and each module mechanically fastened to at least one other module via a flexible strip; and
  a plurality of light emitting diodes located on both front and back major surfaces of each printed circuit board, each diode located a predetermined distance from each other.

39. The cabinet sign of claim 38 wherein the light emitting diodes have a box sign depth factor in the range from about 1.25 to about 0.5.

40. The backlighting system of claim 38, further including a second array of modules interconnected to the first array, wherein each module is interconnected to another module via a male connector from one module and a female connector from the other module.

41. A lighting system for illuminating a sign, the system comprising:
  a plurality of electrically interconnected modules each module including a support, circuitry on a front surface and a back surface of the support, at least one light emitting diode ("LED") electrically connected to the circuitry, one each of the front surface and the back surface;
  one or more insulated electrical conductors electrically connecting the plurality of modules, and
  one or more flexible strips mechanically connecting adjacent modules, the one or more flexible strips being distinct from the one or more insulated electrical conductors.

42. The system of claim 41 wherein each of the electrically interconnected modules further includes one or more electrical connectors and one or more mechanical connectors, the one or more electrical conductors electrically connecting the plurality of modules via the one or more electrical connectors, and the one or more flexible strips mechanically connecting adjacent modules via the one or more mechanical connectors.

43. A cabinet sign comprising:

a cabinet having side wails and opposed front and back walls, at least one of said front and back wails being light transmissive;

an array of light emitting modules, each module comprising a support, circuitry on the support, and at least one light emitting diode ("LED") electrically connected to the circuitry;

the array including a plurality of modules interconnected by one or more electrical connectors, and one or more flexible mechanical connectors;

the array having a first end engaging a side wall of the cabinet and a second end engaging an opposed side wall of the cabinet.

44. The sign of claim 43 further comprising a clamping element for securing the flexible mechanical connecting to the side wall of the sign.

45. The sign of claim 43 wherein each module comprises a plurality of LEDs arranged in a two dimensional array.

46. The sign of claim 43 wherein the one or more electrical conductors are separate from the one or more flexible mechanical connectors.

47. The sign of claim 43 including at least two arrays.

* * * * *